US012218041B2

(12) United States Patent
Choi et al.

(10) Patent No.: US 12,218,041 B2
(45) Date of Patent: Feb. 4, 2025

(54) INTEGRATED CIRCUIT (IC) PACKAGES EMPLOYING A CAPACITOR-EMBEDDED, REDISTRIBUTION LAYER (RDL) SUBSTRATE FOR INTERFACING AN IC CHIP(S) TO A PACKAGE SUBSTRATE, AND RELATED METHODS

(71) Applicant: QUALCOMM Incorporated, San Diego, CA (US)

(72) Inventors: Jihong Choi, San Diego, CA (US); Giridhar Nallapati, San Diego, CA (US); William Stone, San Diego, CA (US); Jianwen Xu, San Diego, CA (US); Jonghae Kim, San Diego, CA (US); Periannan Chidambaram, San Diego, CA (US); Ahmer Syed, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 259 days.

(21) Appl. No.: 17/237,828

(22) Filed: Apr. 22, 2021

(65) Prior Publication Data

US 2022/0344250 A1     Oct. 27, 2022

(51) Int. Cl.
| H01L 23/498 | (2006.01) |
| H01L 21/48 | (2006.01) |
| H01L 49/02 | (2006.01) |

(52) U.S. Cl.
CPC .... *H01L 23/49822* (2013.01); *H01L 21/4857* (2013.01); *H01L 21/486* (2013.01);
(Continued)

(58) Field of Classification Search
CPC ........... H01L 23/49822; H01L 21/4857; H01L 21/486; H01L 23/49827; H01L 23/49833; H01L 28/40
See application file for complete search history.

(56) References Cited

U.S. PATENT DOCUMENTS 8,362,599 B2    1/2013   Kim et al.
9,401,395 B2    7/2016   Tzeng et al.
(Continued)

FOREIGN PATENT DOCUMENTS

CN    110634750 A   *   12/2019          H01L 21/563
EP    0646954 A2   *   4/1995

OTHER PUBLICATIONS

Wikipedia, "Through-Silicon Via", 2023.*
(Continued)

*Primary Examiner* — Evan G Clinton
(74) *Attorney, Agent, or Firm* — Withrow & Terranova, PLLC

(57) ABSTRACT

Integrated circuit (IC) packages employing a capacitor-embedded, redistribution layer (RDL) substrate and related fabrication methods. The embedded capacitor can be coupled to a power distribution network (PDN) to provide decoupling capacitance to reduce current-resistance (IR) drop. The RDL substrate is disposed between the IC chip(s) and the package substrate to minimize distance between the embedded capacitor(s) and the IC chip(s) to reduce the parasitic inductance in the PDN, thus reducing PDN noise. With the RDL substrate disposed between the package substrate and the IC chip(s), the RDL substrate needs to support through-interconnections between the package substrate and the IC chip(s). In this regard, the RDL substrate includes an outer RDL layer adjacent to the IC chip(s) to support small pitch metal interconnects as well as provide fan-out capability. This provides enhanced connectivity compatibility with higher-density die interconnect IC chips while also supporting a closer located embedded capacitor in the PDN.

20 Claims, 20 Drawing Sheets

(52) U.S. Cl.
CPC .. *H01L 23/49827* (2013.01); *H01L 23/49833* (2013.01); *H01L 28/40* (2013.01)

(56) References Cited

U.S. PATENT DOCUMENTS

| | | | |
|---|---|---|---|
| 9,478,474 | B2 | 10/2016 | Chen et al. |
| 9,935,052 | B1 | 4/2018 | Liu et al. |
| 10,090,284 | B2 | 10/2018 | Chen et al. |
| 2005/0207091 | A1 | 9/2005 | Kambe et al. |
| 2007/0052086 | A1* | 3/2007 | Oi ........................... H01L 24/82 |
| | | | 257/E23.178 |
| 2013/0038981 | A1 | 2/2013 | Imanaka et al. |
| 2015/0171015 | A1* | 6/2015 | Mahajan ............. H01L 23/3114 |
| | | | 257/774 |
| 2017/0338207 | A1 | 11/2017 | Chen et al. |
| 2019/0131273 | A1* | 5/2019 | Chen .................... H01L 21/568 |
| 2019/0148342 | A1 | 5/2019 | Hu et al. |
| 2019/0393153 | A1* | 12/2019 | Wang ................ H01L 21/76898 |
| 2020/0273809 | A1* | 8/2020 | Liu ..................... H01L 23/5385 |
| 2020/0286818 | A1 | 9/2020 | Cho et al. |
| 2020/0365544 | A1 | 11/2020 | Chen et al. |
| 2020/0395300 | A1* | 12/2020 | Xie ..................... H01L 23/5386 |
| 2020/0402965 | A1 | 12/2020 | Ng et al. |
| 2021/0020574 | A1* | 1/2021 | Yu ....................... H01L 25/0652 |
| 2021/0091005 | A1* | 3/2021 | Tsai ...................... H01L 23/3121 |
| 2022/0310777 | A1* | 9/2022 | O'Sullivan ............. H01L 24/16 |

OTHER PUBLICATIONS

International Search Report and Written Opinion for International Patent Application No. PCT/US2022/071621, mailed Jul. 22, 2022, 16 pages.

* cited by examiner

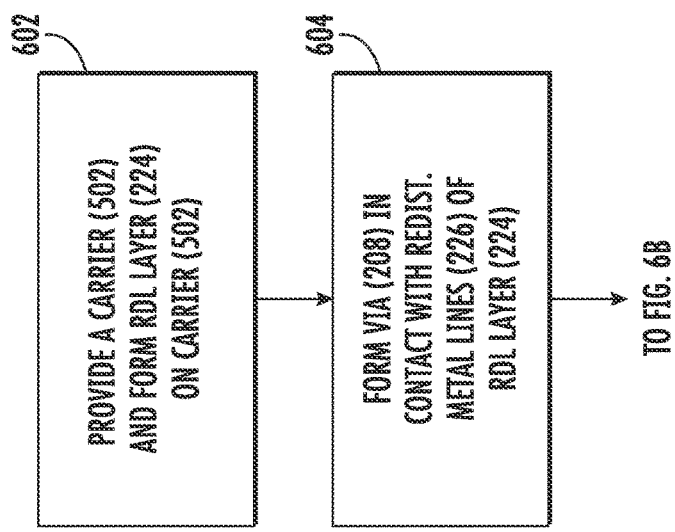
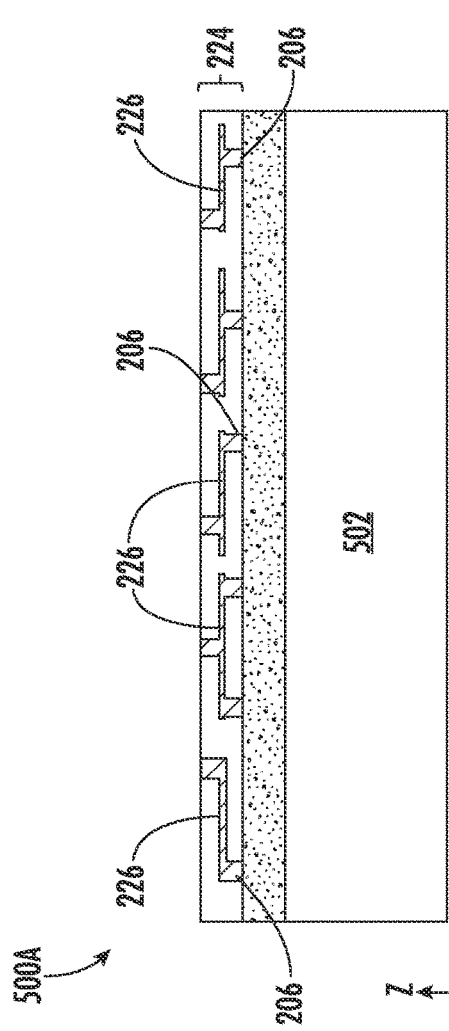
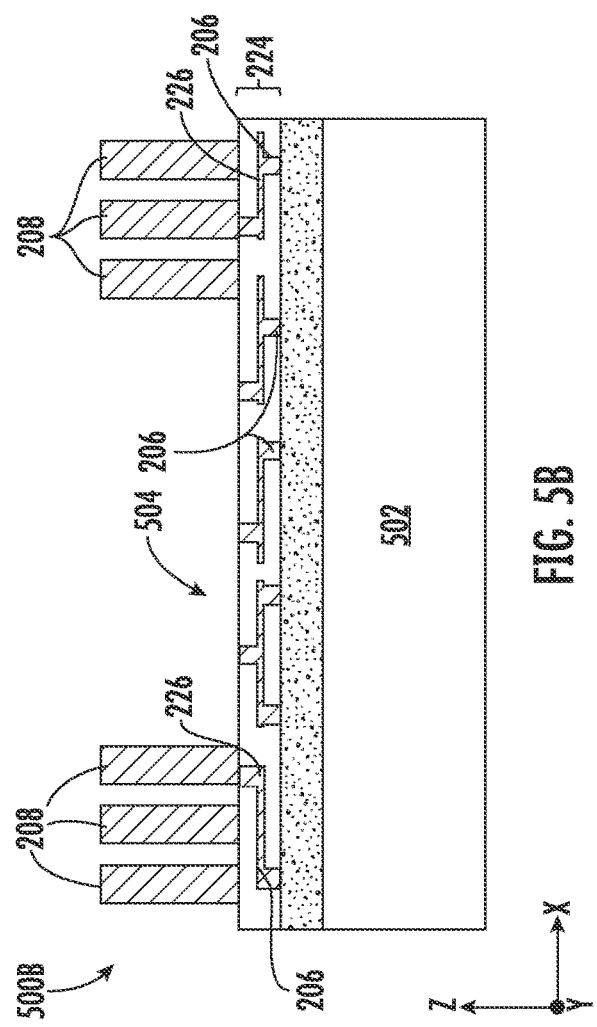

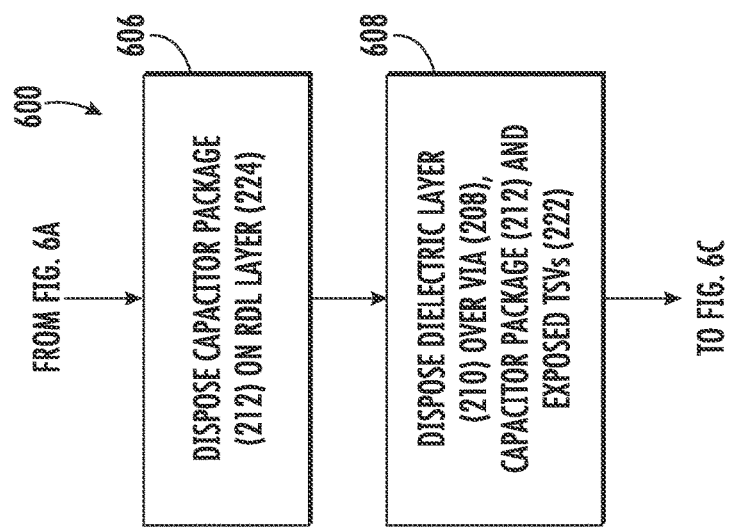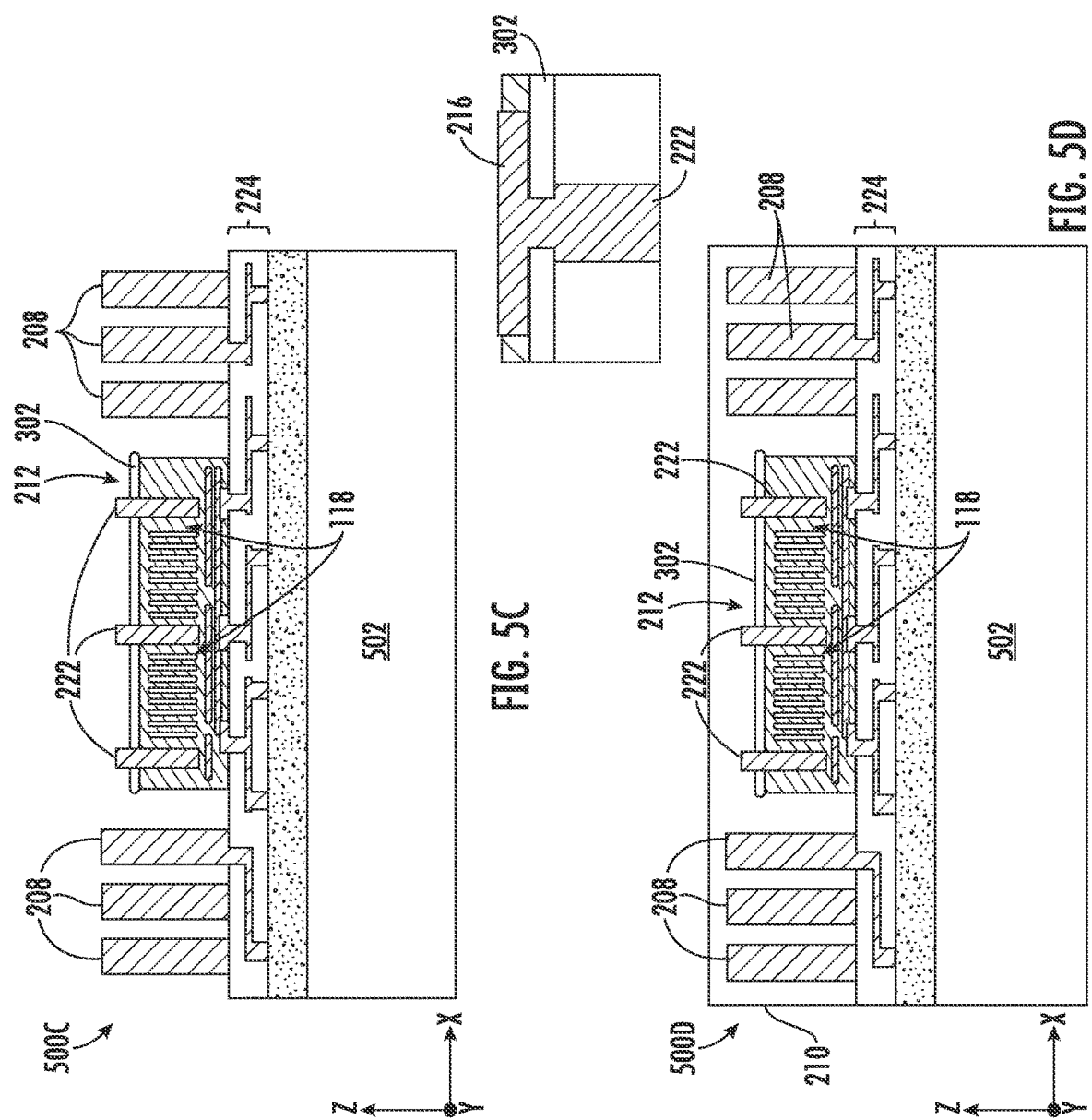

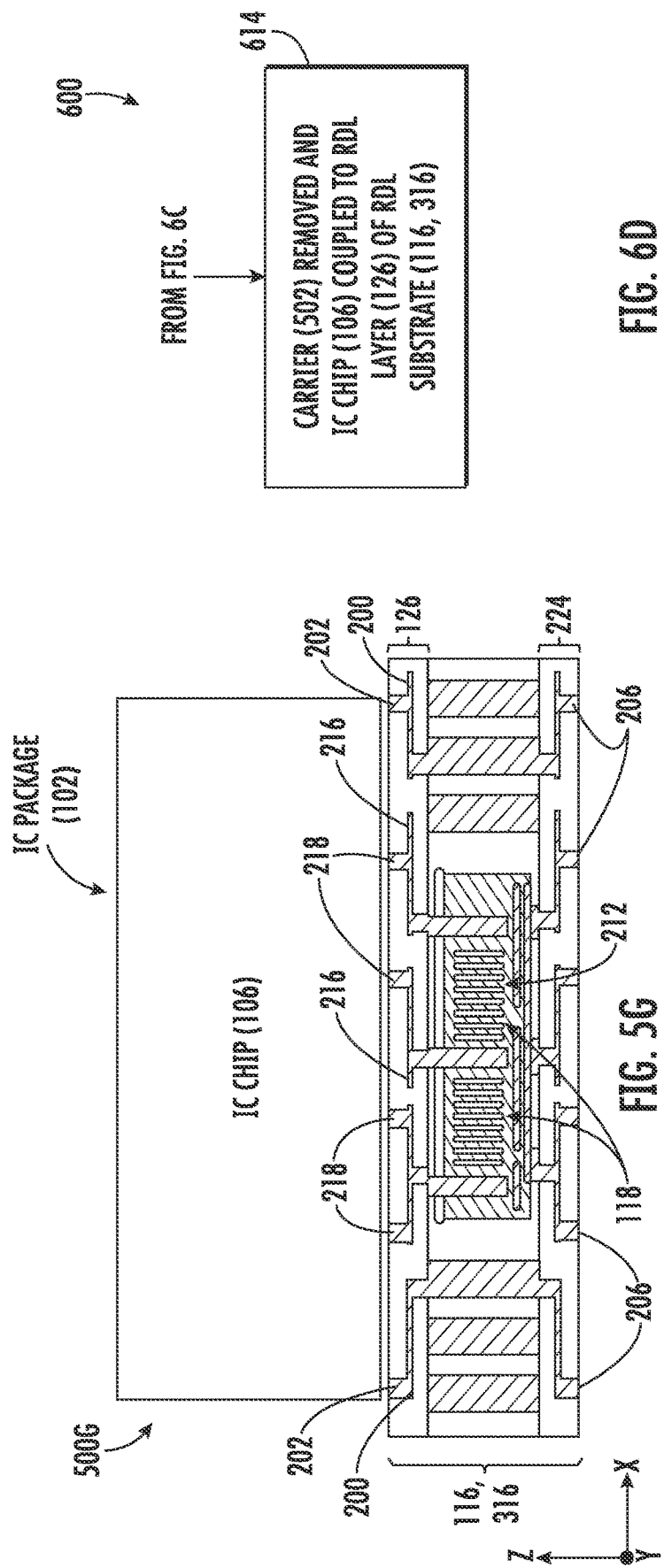

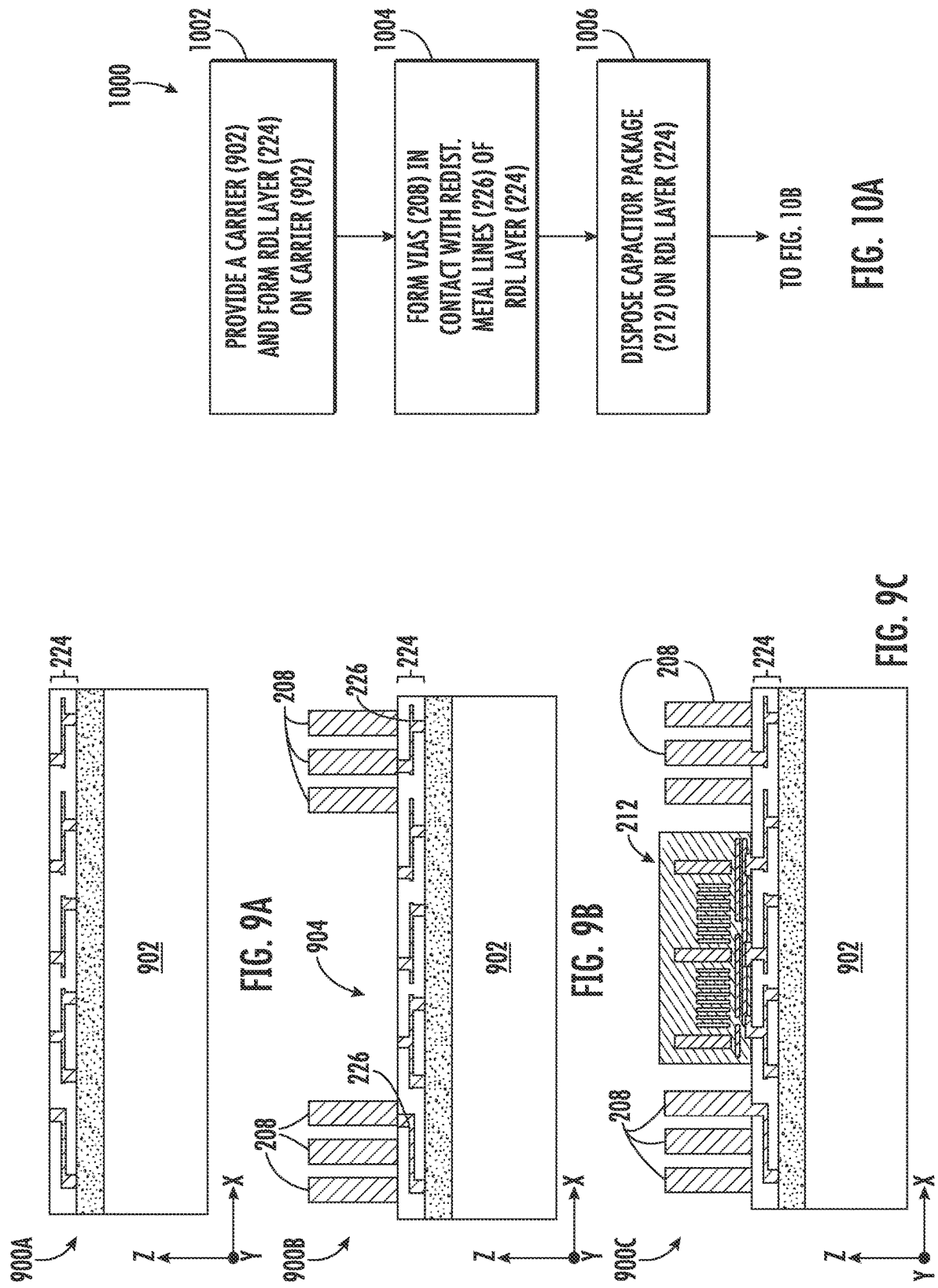

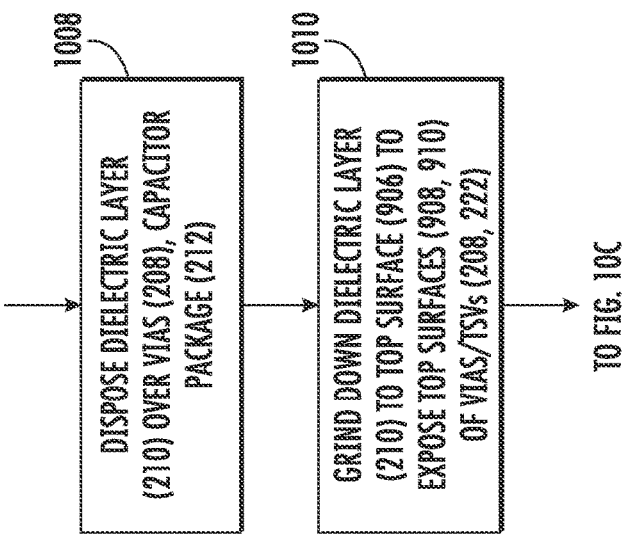
FIG. 10B
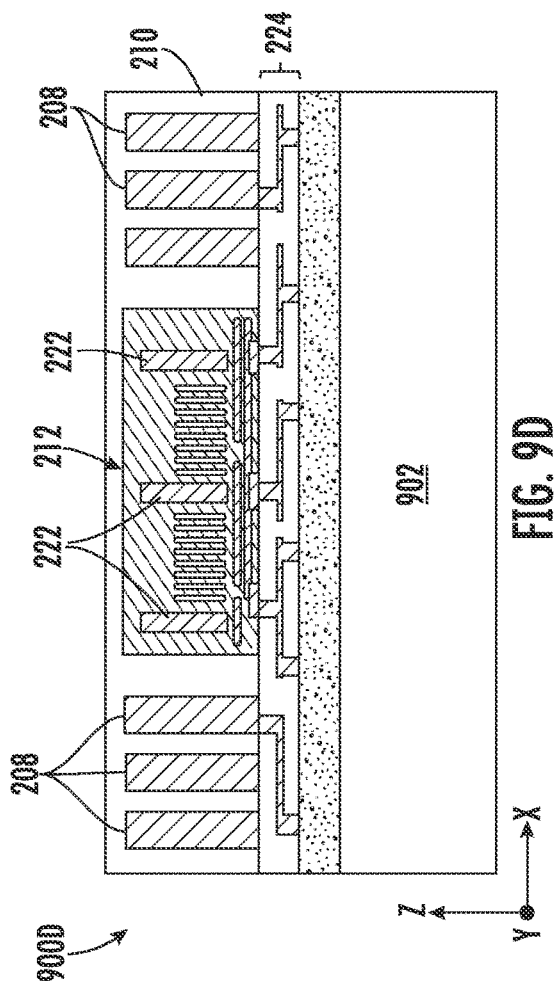
FIG. 9D
FIG. 9E
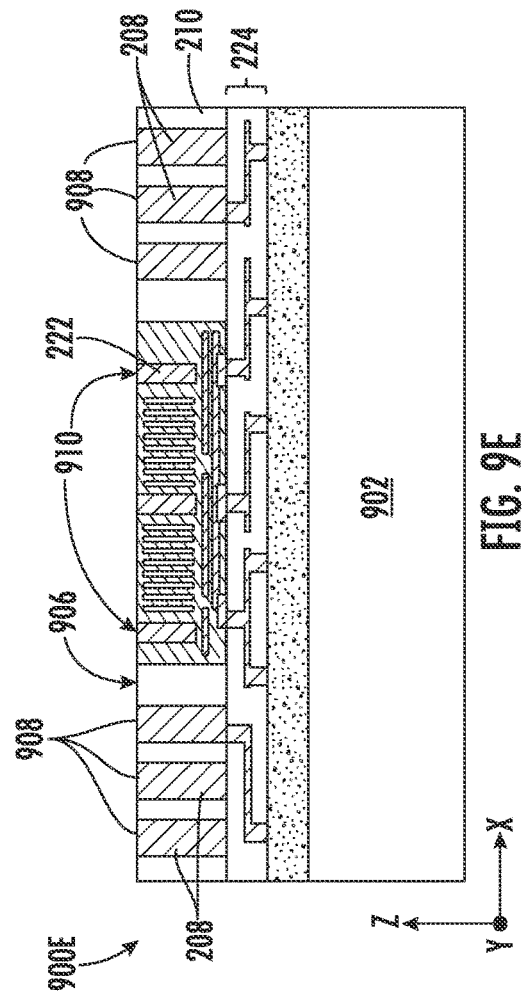

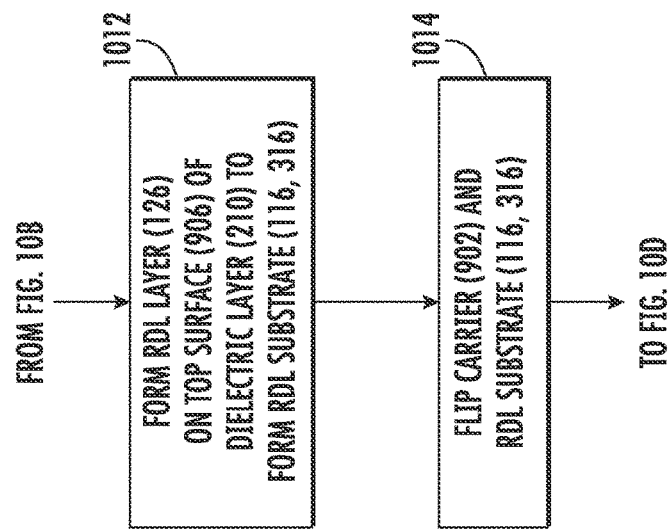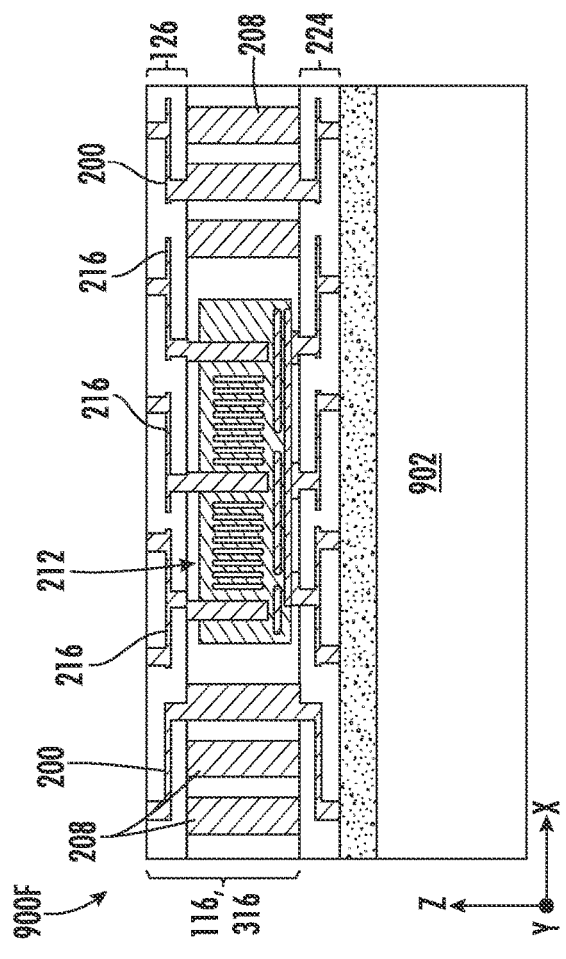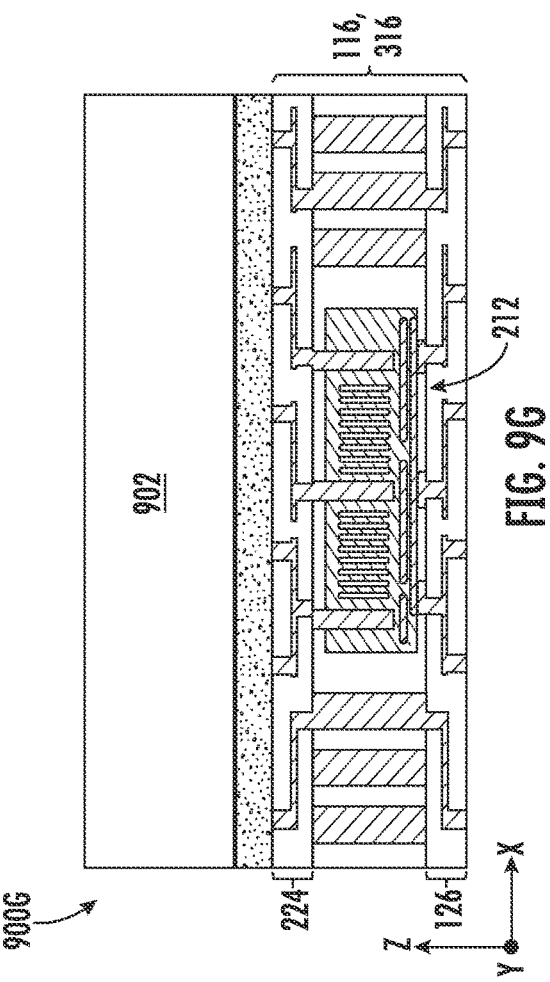

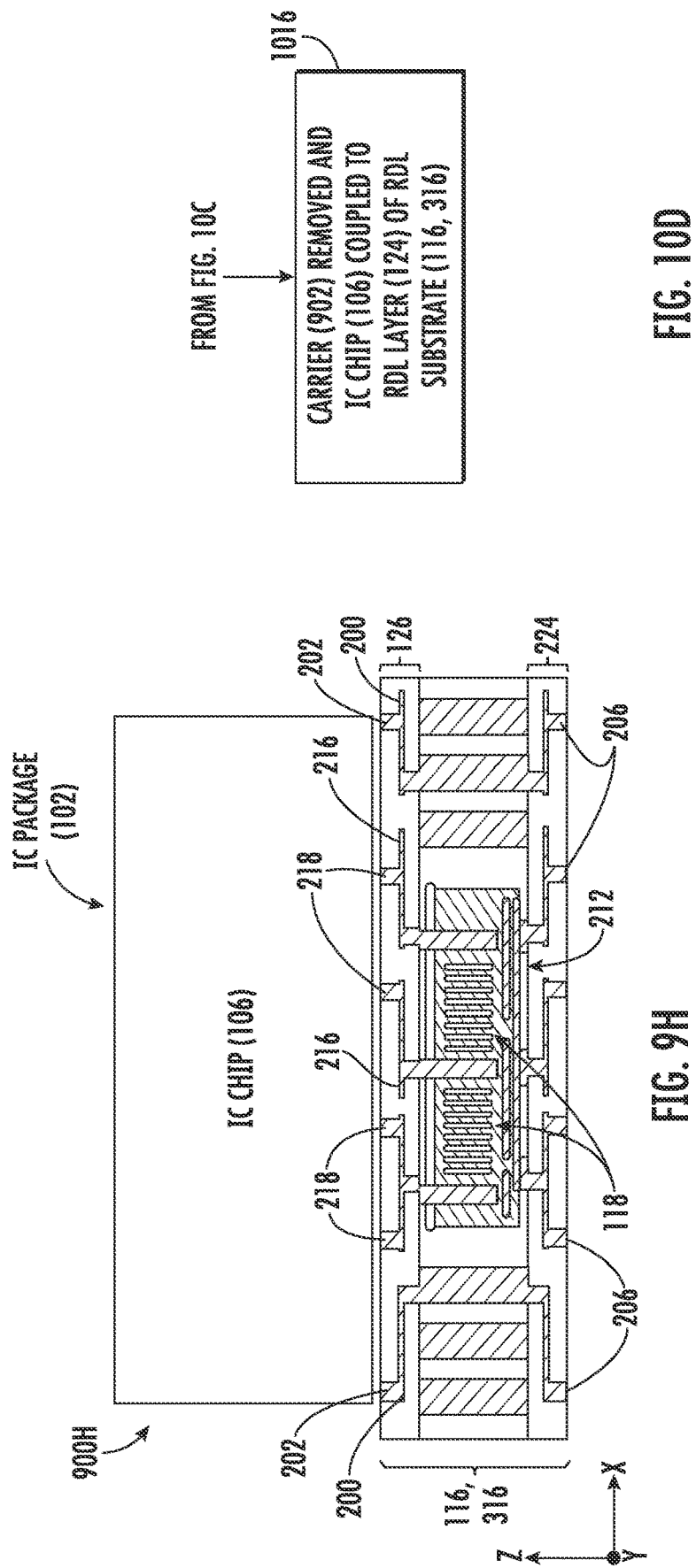

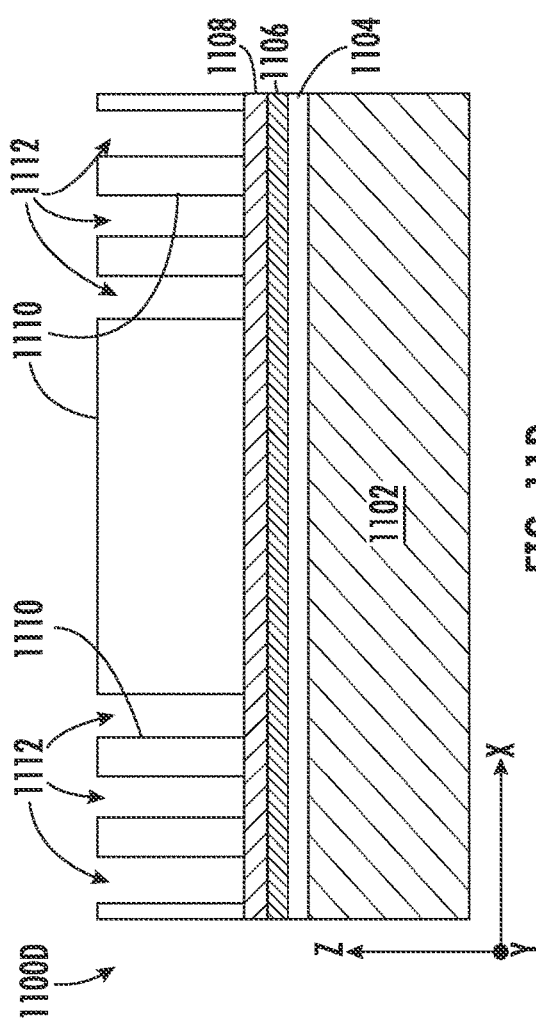
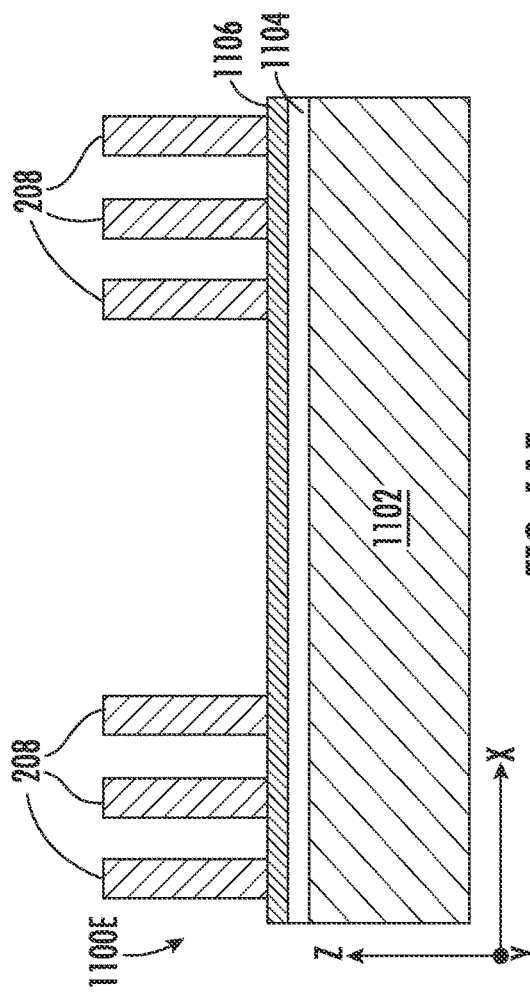
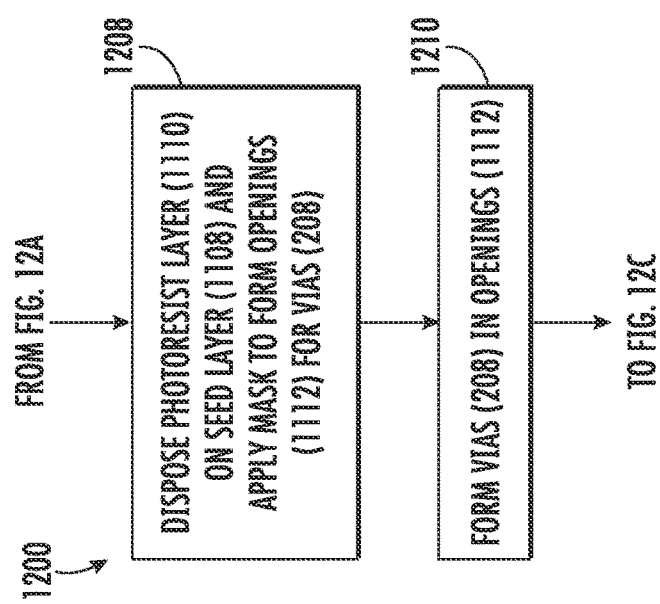

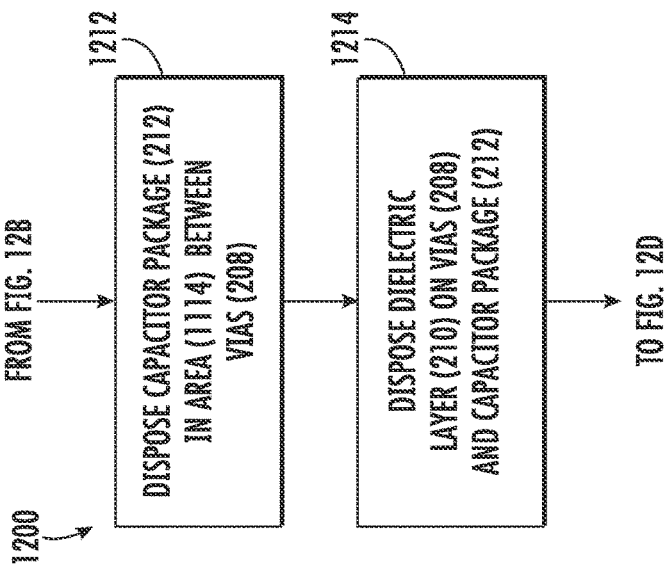
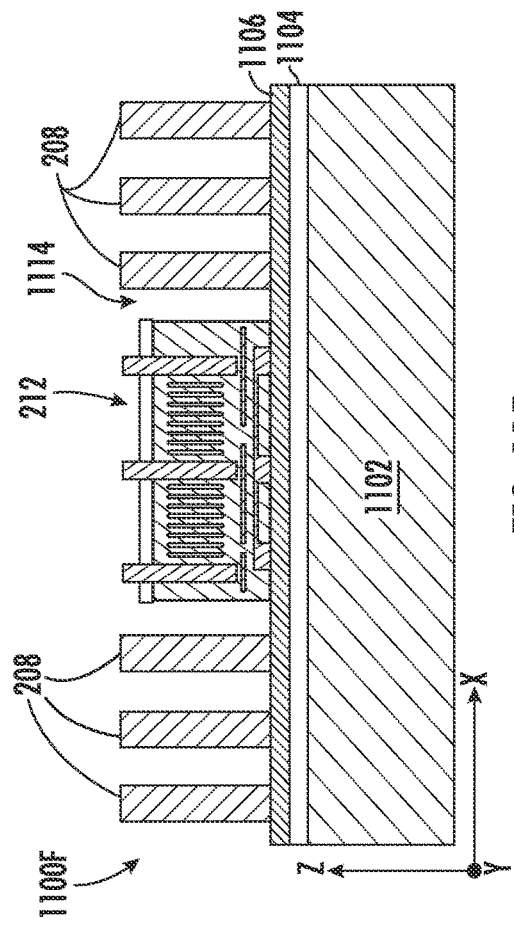
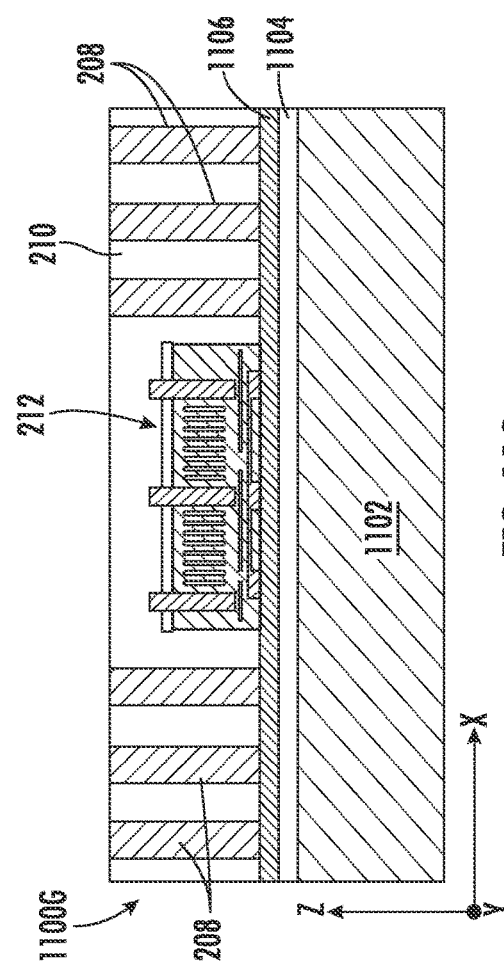

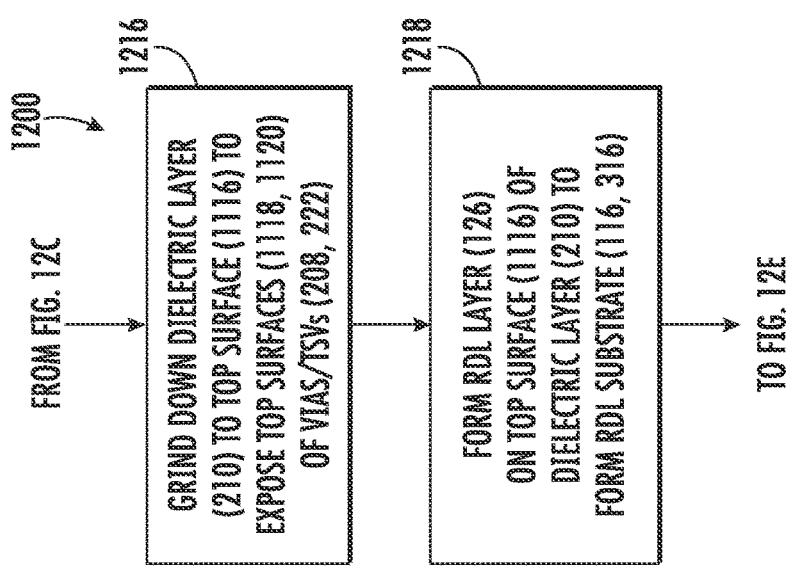
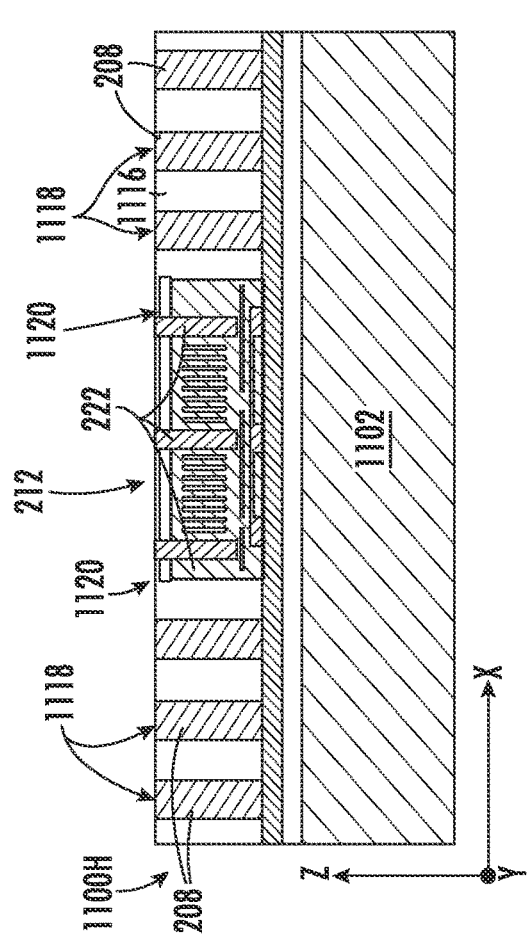
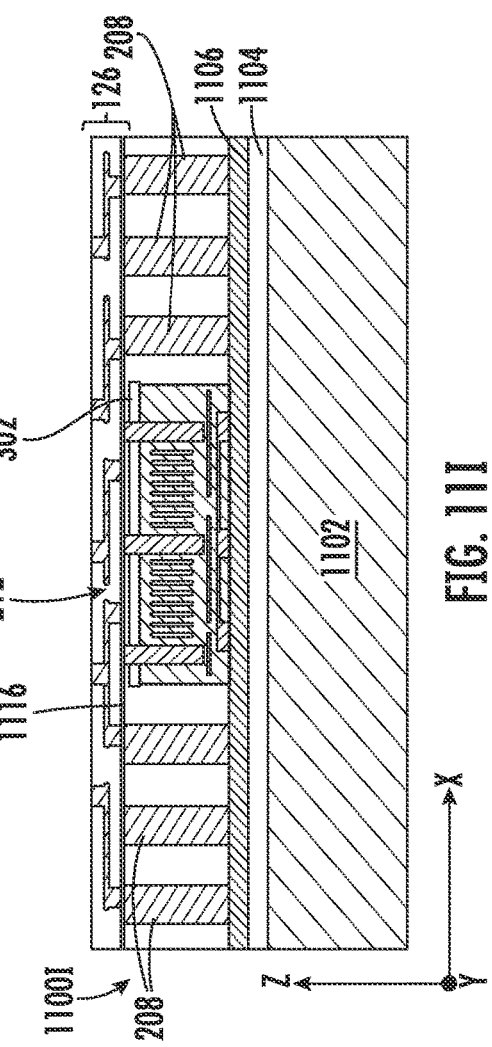

INTEGRATED CIRCUIT (IC) PACKAGES EMPLOYING A CAPACITOR-EMBEDDED, REDISTRIBUTION LAYER (RDL) SUBSTRATE FOR INTERFACING AN IC CHIP(S) TO A PACKAGE SUBSTRATE, AND RELATED METHODS

BACKGROUND

I. Field of the Disclosure

The field of the disclosure relates to integrated circuit (IC) packages, and more particularly to providing decoupling capacitance in a power distribution network (PDN) of the IC package for reducing current-resistance (IR) drop and voltage droop.

II. Background

Integrated circuits (ICs) are the cornerstone of electronic devices. ICs are typically packaged in an IC package, also called a "semiconductor package" or "chip package." The IC package includes a package substrate and one or more IC chips or other electronic modules mounted to the package substrate to provide electrical connectivity to the IC chips. For example, an IC chip in an IC package may be a system-on-a chip (SoC). The IC chips are electrically coupled to other IC chips and/or to other components in the IC package through electrical coupling to metal lines in the package substrate. The IC chips can also be electrically coupled to other circuits outside the IC package through electrical connections of external metal interconnects (e.g., solder bumps) of the IC package.

High-performance compute chips in IC packages require effective power distribution networks (PDN) to distribute power to the circuits and other components in the IC chip efficiently. For example, an IC package may include a separate power management chip (PMC) that includes voltage regulator circuitry configured to distribute voltage to other IC chips in the IC package. Noise can occur in the PDN due to current-resistance (IR) drop between the PMC and a powered IC chip due to the series resistance and inductance in the PDN. Change in current draw from a powered IC chip to the PDN can induce noise in the PDN. If the magnitude of noise in the PDN exceeds a certain threshold, it alters the voltages delivered to the IC chips and its circuits below the acceptable values, which can cause malfunction of circuits. Even if a PDN supplies a voltage to the IC chips within tolerance, the PDN noise may still cause other problems. It can cause or appear as crosstalk on signal lines. Further, as PDN interconnects typically carry higher currents, high-frequency PDN noise has the potential of creating electromagnetic radiation interference, possibly causing other failures.

Thus, it is important to control noise in a PDN. In this regard, decoupling capacitors are employed to shunt PDN noise in the PDN to reduce its effect on the IC chips powered by the PDN. A decoupling capacitor can be mounted on a package substrate or embedded within a package substrate of an IC package to provide decoupling capacitance between the power source and IC chips. However, the electrical path connection between the decoupling capacitor and the IC chips has a parasitic inductance that can contribute to IR drop and PDN noise in an undesired manner.

SUMMARY OF THE DISCLOSURE

Aspects disclosed herein include integrated circuit (IC) packages employing an embedded-capacitor, redistribution layer (RDL) substrate for interfacing an IC chip(s) to a package substrate. A RDL substrate is a substrate that includes a RDL layer that includes one or more metal redistribution lines supporting fan-out of metal interconnects. The embedded capacitor(s) can provide a decoupling capacitance for a power distribution network (PDN) in the IC package to reduce current-resistance (IR) drop as an example. Related fabrication methods are also disclosed. The IC package includes a package substrate and one or more IC chips electrically coupled to the package substrate. The package substrate includes one or more substrate layers with metal traces or lines embedded therein to provide electrical signal routing to and from the IC chip(s). The package substrate supports a PDN that carries electrical power signals at a given voltage for distribution to the IC chip(s) for operation. In exemplary aspects, the RDL substrate that supports the embedded capacitor is disposed between the IC chip(s) and the package substrate to minimize the distance between the embedded capacitor(s) and the IC chip(s). This can reduce the parasitic inductance in the power distribution lines between the embedded capacitor(s) and the IC chip(s) to reduces the IR drop in the PDN, which in turn reduces PDN noise. However, with the RDL substrate disposed between the package substrate and the IC chip(s), the RDL substrate needs to support through-interconnections for an electrical interface between the package substrate and the IC chip(s). The IC chip(s) may have a high density of die interconnects that need to be electrically coupled to the package substrate. In this regard, the RDL substrate is provided to include a first outer RDL layer adjacent to the IC chip(s). The first outer RDL layer, being formed from a RDL process, allows the first outer RDL layer to support small pitch metal interconnects as well as provide fan-out capability. This allows the RDL substrate to provide enhanced connectivity compatibility with higher-density die interconnect IC chips while at the same time supporting an embedded capacitor closely located to the IC chip to minimize IR drop.

In an exemplary aspect, the RDL substrate can also include a second outer RDL layer that is adjacent to the package substrate. The metal interconnects of the second outer RDL layer can be formed with a different pitch from the metal interconnects of the first outer RDL layer for greater flexibility in providing a compatible package substrate in the IC package. For example, the die interconnect pitch of the IC chip may be much tighter (i.e., smaller) than the metal interconnect pitch of the package substrate. In this regard, the RDL layer can facilitate electrical coupling between the IC chip and a package substrate that have metal interconnects of different pitches for enhanced compatibility and ease in package fabrication processes. This can also provide a greater flexibility in choice of package substrates employed in the IC package to achieve pitch compatibility between the IC chip(s) and the package substrate for reduced cost, and/or ease in manufacturability, as examples.

In another exemplary aspect, the embedded capacitor can be included in a capacitor package that is embedded in the RDL substrate. In another exemplary aspect, to minimize the vertical interconnection path disturbance between the IC chip(s) and the package substrate in the vertical path of the embedded capacitor, through-silica-vertical interconnection accesses (vias) (TSVs) can be employed. The TSVs are disposed through the packaging dielectric of the embedded capacitor package to provide electrical through-connections between the IC chip(s) and the package substrate and/or to the embedded capacitor(s). In this manner, the RDL substrate is not limited to supporting vertical interconnects between the IC chip(s) and the package substrate only outside the area of the embedded capacitor package. In another exemplary aspect, the IC package also includes through-interconnects, such as through-mold-vias (TMV), that extend through the RDL substrate outside of the embedded capacitor package. These other through-interconnects provide pass-through electrical connections (e.g., input/output (I/O) connections) between the IC chip(s) and the package substrate. The RDL substrate can also more easily facilitate through-interconnects of a larger diameter and/or a higher aspect ratio that may be required due the increased distance between the package substrate and IC chip(s) due to the RDL substrate disposed therebetween.

In this regard, in one exemplary aspect, an integrated circuit (IC) package is provided. The IC package comprises a package substrate comprising a plurality of package substrate interconnects. The IC package also comprises an IC chip comprising a plurality of die interconnects. The IC package also comprises a RDL substrate disposed between the package substrate and the IC chip. The RDL substrates comprises a RDL layer comprising a plurality of redistribution metal lines each comprising a RDL interconnect coupled to a die interconnect among the plurality of die interconnects. The RDL substrate also comprises a substrate layer comprising a plurality of substrate interconnects. The RDL substrate also comprises a capacitor disposed between the RDL layer and the substrate layer. The IC package also comprises at least one via electrically coupled to a die interconnect among the plurality of die interconnects and the capacitor.

In another exemplary aspect, a method of fabricating an IC package is provided. The method comprises forming a package substrate comprising a plurality of package substrate interconnects. The method also comprises forming a RDL substrate on the package substrate, comprising forming a RDL layer comprising a plurality of redistribution metal lines each comprising a RDL interconnect, forming a substrate layer comprising a plurality of substrate interconnects, and disposing a capacitor between the RDL layer and the substrate layer. The method also comprises forming at least one via electrically coupled to the capacitor and configured to be electrically coupled to at least one die interconnect among a plurality of die interconnects of an IC chip. The method also comprises coupling at least one die interconnect among a plurality of die interconnects of the IC chip to at least one RDL interconnect among the plurality of redistribution metal lines.

In another exemplary aspect, RDL substrate is provided. The RDL substrate comprises a RDL layer comprising a plurality of redistribution metal lines each comprising a RDL interconnect. The RDL substrate also comprises a substrate layer comprising a plurality of substrate interconnects. The RDL substrate also comprises a dielectric layer comprising a dielectric material disposed between the RDL layer and the substrate layer. The RDL substrate also comprises a capacitor package embedded in the dielectric layer, the capacitor package comprising a capacitor. The RDL substrate also comprises a plurality of TSVs disposed through the capacitor package and electrically coupled to RDL interconnect among a plurality of RDL interconnects.

BRIEF DESCRIPTION OF THE FIGURES

FIGS. 5A-5G illustrate exemplary fabrication stages of another exemplary process of fabricating an IC package that includes a capacitor-embedded, RDL substrate disposed between an IC chip(s) and package substrate, including, but not limited to, the IC packages and RDL substrates in FIGS. 1-3, wherein a RDL layer of the RDL substrate is formed before a capacitor package is embedded in the RDL substrate;

FIGS. 6A-6D are a flowchart illustrating an exemplary process of fabricating the IC package that includes a capacitor-embedded, RDL substrate disposed between an IC chip(s) and package substrate according to the exemplary fabrication stages in FIGS. 5A-5G;

FIGS. 9A-9H illustrate another exemplary fabrication stages of another exemplary process of fabricating an IC package that includes a capacitor-embedded, RDL substrate disposed between an IC chip(s) and package substrate, including, but not limited to, the IC packages and RDL substrates in FIGS. 1-3, wherein a RDL layer of the RDL substrate is formed before a capacitor package is embedded in the RDL substrate;

FIGS. 10A-10D are a flowchart illustrating an exemplary process of fabricating the IC package that includes a capacitor-embedded, RDL substrate disposed between an IC chip(s) and package substrate according to the exemplary fabrication stages in FIGS. 9A-9H;

FIGS. 11A-11L illustrate exemplary fabrication stages of another exemplary process of fabricating an IC package that includes a capacitor-embedded, RDL substrate disposed between an IC chip(s) and package substrate, including, but not limited to, the IC packages and RDL substrates in FIGS. 1-3, wherein a RDL layer of the RDL substrate is formed after the embedded capacitor package is embedded in the RDL substrate;

FIGS. 12A-12F are a flowchart illustrating an exemplary process of fabricating the IC package that includes a capacitor-embedded, RDL substrate disposed between an IC chip(s) and package substrate according to the exemplary fabrication stages in FIGS. 11A-11L.

DETAILED DESCRIPTION

Figure 1:
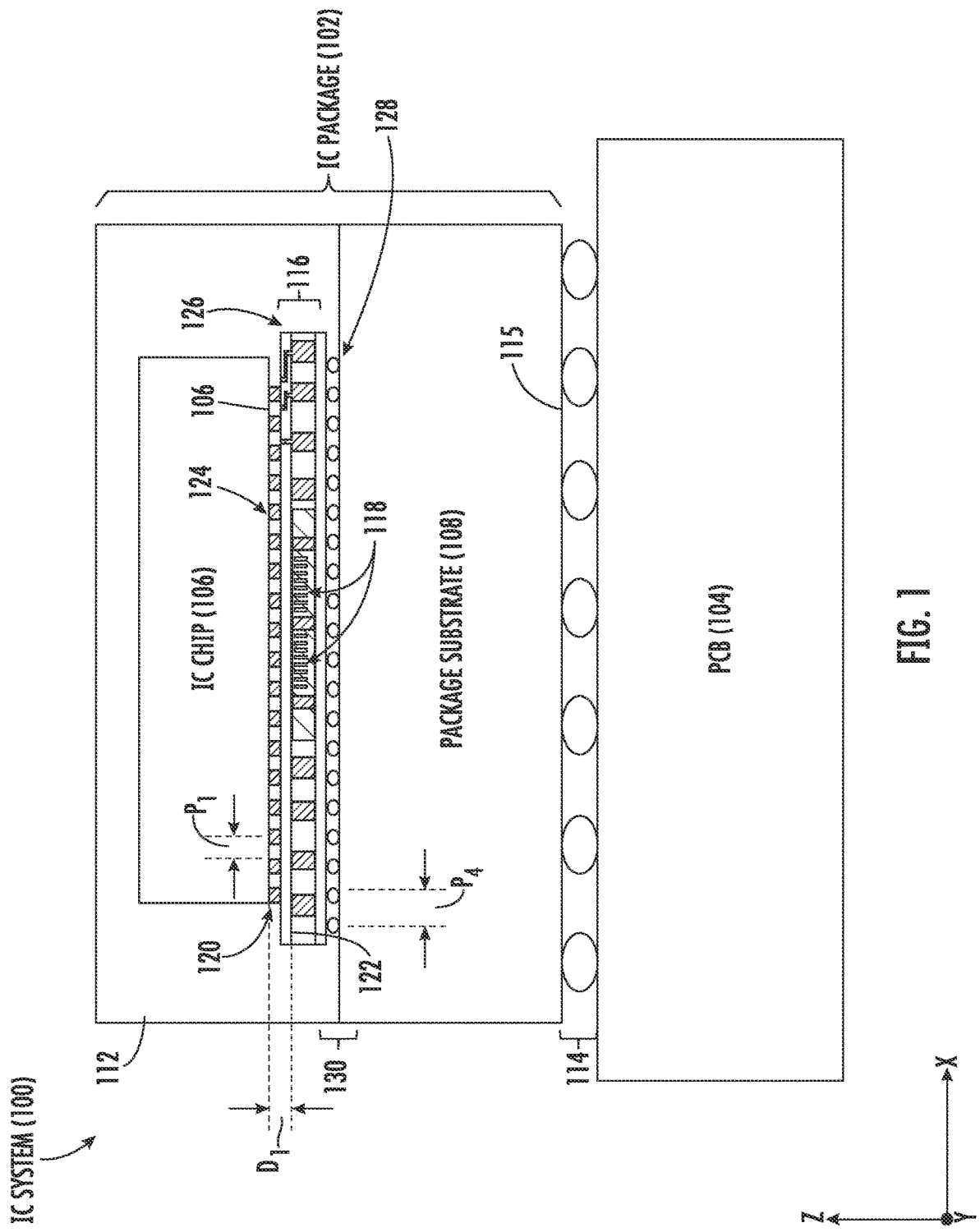
FIG. 1 is a side view of an exemplary integrated circuit (IC) system that includes an IC package mounted to a printed circuit board (PCB), wherein the IC package includes a capacitor-embedded, redistribution layer (RDL) substrate disposed between an IC chip(s) and package substrate, that can provide a decoupling capacitance for a power distribution network (PDN) in the IC package.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuit (IC) packages employing an embedded-capacitor, redistribution layer (RDL) substrate for interfacing an IC chip(s) to a package substrate. A RDL substrate is a substate that includes a RDL layer that includes one or more metal redistribution lines supporting fan-out of metal interconnects. The embedded capacitor(s) can provide a decoupling capacitance for a power distribution network (PDN) in the IC package to reduce current-resistance (IR) drop as an example. Related fabrication methods are also disclosed. The IC package includes a package substrate and one or more IC chips electrically coupled to the package substrate. The package substrate includes one or more substrate layers with metal traces or lines embedded therein to provide electrical signal routing to and from the IC chip(s). The package substrate supports a power distribution network (PDN) that carries electrical power signals at a given voltage for distribution to the IC chip(s) for operation. In exemplary aspects, the RDL substrate that supports the embedded capacitor is disposed between the IC chip(s) and the package substrate to minimize the distance between the embedded capacitor(s) and the IC chip(s). This can reduce the parasitic inductance in the power distribution lines between the embedded capacitor(s) and the IC chip(s) to reduces the IR drop in the PDN, which in turn reduce PDN noise. However, with the RDL substrate disposed between the package substrate and the IC chip(s), the RDL substrate needs to support through-interconnections for an electrical interface between the package substrate and the IC chip(s). The IC chip(s) may have a high density of die interconnects that need to be electrically coupled to the package substrate. In this regard, the RDL substrate is provided to includes an outer RDL layer adjacent to the IC chip(s). The outer RDL layer, being formed from a RDL process, allows outer RDL layer to supports small pitch metal interconnects as well as provide fan-out capability. This allows the RDL substrate to provide enhanced connectivity compatibility with higher-density die interconnect IC chips while at the same time supporting an embedded capacitor closely located to the IC chip to minimize IR drop.

In this regard, FIG. 1 is a side view of an exemplary IC system 100 that includes an IC package 102 mounted to a printed circuit board (PCB) 104. The IC package 102 includes an IC chip 106 supported by a package substrate 108. The IC chip 106 and package substrate 108 are encapsulated by an over-molding material 112 in this example. The IC chip 106 can include circuitry for a specific type of application, such as a radio frequency (RF) transceiver or a computer-based system-on-a-chip (SoC) as non-limiting examples. The package substrate 108 supports the IC chip 106 of the IC package 102 and includes one or more metal layers of metal lines to provide electrical coupling paths between the IC chip 106 and the PCB 104 to support signaling between the IC chip 106 and other circuits external to the IC package 102. The package substrate 108 can be formed from layers of organic material laminates with metal traces formed therein that are then laminated together as one example. The package substrate 108 can also include a RDL layer to support fan-out of electrical connections as another example. The IC chip 106 is electrically coupled to other external circuits through external package interconnects 114, also referred to as "interconnect bumps," formed on a bottom surface 115 of the package substrate 108 and electrically coupled to metal lines therein that are electrically coupled to the IC chip 106.

As discussed in more detail below, the IC package 102 includes a capacitor-embedded, RDL substrate 116 (also referred to as "RDL substrate") that is disposed between the IC chip 106 and the package substrate 108. As discussed below, the RDL substrate 116 is a substrate that includes a RDL layer that includes one or more metal redistribution lines supporting fan-out of metal interconnects. The RDL substrate 116 includes one or more capacitors 118. The capacitor(s) 118 can provide a decoupling capacitance for a PDN in the IC package 102 to reduce IR drop as an example. For example, a ground power conductor of the IC chip 106 may be coupled through one of its die interconnects 120 to a capacitor(s) 118 through the RDL substrate 116 to provide a decoupling capacitance for a power signal (e.g., a voltage signal) to ground. The RDL substrate 116 supports the embedded capacitor(s) 118 to be disposed between the IC chip 106 and the package substrate 108 to minimize the distance $D_1$ between the embedded capacitor(s) 118 and the IC chip 106. Distance $D_1$ is shown in FIG. 1 as the distance between an outer surface 122 of the package substrate 108 and an active surface 124 of the IC chip 106. For example, distance $D_1$ may be at least two (2) micrometers (μm). This can reduce the parasitic inductance in power distribution lines of a PDN between the embedded capacitor(s) 118 and the IC chip 106 to reduces the IR drop in the PDN, which in turn reduce PDN noise.

Figure 2:
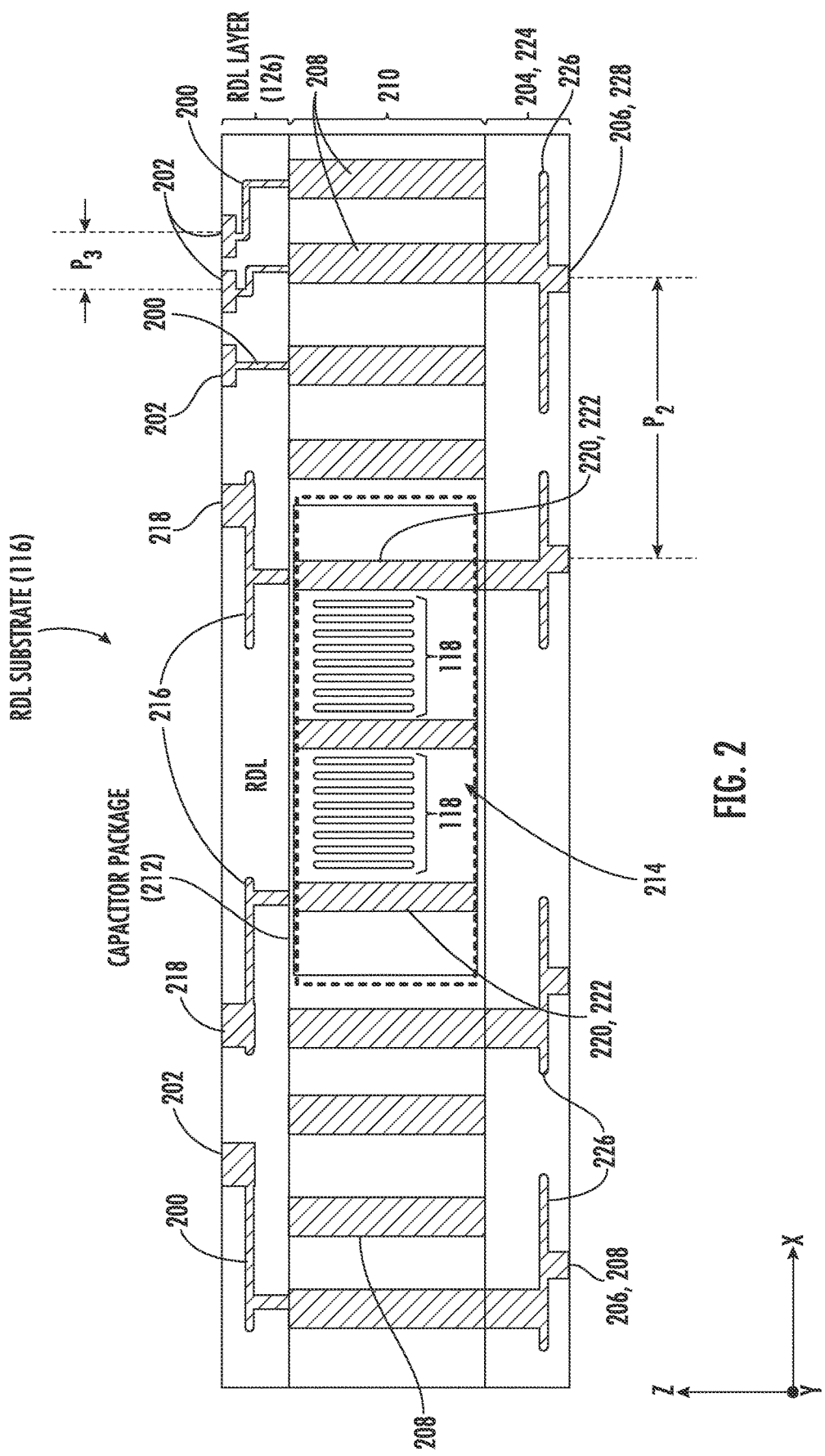
FIG. 2 is a side view of an exemplary RDL substrate that can be employed in the IC package in FIG. 1, wherein the RDL substrate includes an embedded capacitor package that includes capacitors.

However, with the RDL substrate 116 disposed between the package substrate 108 and the IC chip 106, the RDL substrate 116 needs to support through-interconnections for an electrical interface between the package substrate 108 and the IC chip 106. The IC chip 106 may have a high density of die interconnects 120 that need to be electrically coupled to the package substrate 108. In this regard, as shown in FIG. 2 illustrating a more detailed side view of the RDL substrate 116 of FIG. 1, the RDL substrate 116 is provided to include an outer RDL layer 126. As shown in FIG. 1, the outer RDL layer 126 is adjacent to the active surface 124 of the IC chip 106. The outer RDL layer 126, being formed from a RDL process in one example, includes a plurality of redistribution metal lines 200 each comprising a respective RDL interconnect 202 that can be coupled to a die interconnect 120 of the IC chip 106 when the IC chip 106 is disposed on the RDL substrate 116. A solder bump can be formed and coupled to a RDL interconnect 220 to be coupled to a die interconnect 120 as an example. In this manner, the outer RDL layer 126 of the RDL substrate 116 can support small, high-density pitch die interconnects 120 of the IC chip 106 as well as provide fan-out capability between the die interconnects 120 and RDL substrate 116. This in turn allows the RDL substrate 116 to provide enhanced connectivity compatibility with higher-density die interconnect IC chips, such as IC chip 106, while at the same time supporting an embedded capacitor, such as capacitors 118, more closely located to the IC chip 106 to minimize IR drop when coupled to a PDN in the IC package 102.

With reference to FIG. 2, the RDL substrate 116 includes the outer RDL layer 126 (shown as a top layer in FIG. 2 in the Z-axis direction) that includes redistribution metal lines 200 that can include a respective RDL interconnect 202 that can be coupled to a respective die interconnect 120 of the IC chip 106 (shown in FIG. 1). With reference back to FIG. 1, the package substrate 108 includes a plurality of package substrate interconnects 128 in a package substrate layer 130 that can be electrically coupled to the RDL substrate 116 to provide an electrical interface between the package substrate 108 and the IC chip 106 through the RDL substrate 116. With reference back to FIG. 2, the RDL substrate 116 also includes a substrate layer 204 that is a bottom layer located beneath the RDL layer 126. The substrate layer 204 includes the substrate interconnects 206 that are configured to be coupled to respective package substrate interconnects 128 in a top, adjacent package substrate layer 130 of the package substrate 108 as shown in FIG. 1. This provides an electrical interface between the package substrate 108 and the RDL substrate 116. An electrical interface is provided in the RDL substrate 116 by an electrical coupling between RDL interconnects 202 in the RDL layer 126 and substrate interconnects 206 in the substrate layer 204 through respective vias 208 that extend through a dielectric layer 210 between the RDL layer 126 and the substrate layer 204. In this regard, the vias 208 can be considered through-mold vias (TMVs) that extend through the dielectric layer 210. For example, the vias 208 may be copper pillars. The vias 208 extend through the dielectric layer 210 of the RDL substrate 116 outside the area of a capacitor package 212. The substrate interconnects 206 can be coupled to a respective package substrate interconnect 128 of the package substrate 108 as shown in FIG. 1. The external package interconnects 114 can be electrically coupled to package substrate interconnects 128 in the package substate layer 130 of the package substrate 108.

In this manner, an electrical interface is provided in the IC package 102 in FIG. 1 to the IC chip 106. The electrical interface includes the external package interconnects 114 and their electrical coupling to package substrate interconnects 128, substrate interconnects 206 of the RDL substrate 116, vias 208 and RDL interconnects 202 of the RDL substrate 116, and to the die interconnects 120 of the IC chip 106 (in FIG. 1).

In this example of the RDL substrate 116 in FIG. 2, the capacitors 118 are included in the capacitor package 212. The capacitor package 212 includes a dielectric layer 214 comprising a dielectric material disposed between the RDL layer 126 and the substrate layer 204. The capacitors 118 are embedded in the dielectric layer 214 of the capacitor package 212. The capacitor package 212 is embedded in the dielectric layer 210 of the RDL substrate 116. The capacitor package 212 can be formed as a separate package, such as a chiplet, as will be discussed in more detail below. In this example RDL substrate 116 in FIG. 2, to provide an electrical interface between the IC chip 106 and the capacitors 118 in the capacitor package 212, the RDL layer 126 of the package substrate 108 also includes redistribution metal lines 216 that can include respective RDL interconnects 218 that can be coupled to a respective die interconnect 120 of the IC chip 106 (see FIG. 1). However, in this example, the RDL interconnects 218 are coupled to the capacitors 118 through vias 220. For example, the vias 220 can be through-silicon-vias (TSVs) 222 that extend through the dielectric layer 214 of the capacitor package 212. In this manner, the redistribution metal lines 216 and their respective RDL interconnects 218 of the RDL layer 126 of the RDL substrate 116 provide an interface between the capacitors 118 and the IC chip 106 to, for example, provide a decoupling capacitance to the PDN in the IC chip 106. For example, the capacitors 118 may be coupled to a ground node in the PDN in the IC chip 106 coupled to the die interconnects 120 that are coupled to the RDL interconnects 218 (see also FIG. 1).

Also, with reference to FIG. 2, note that the substrate layer 204 of the RDL substrate 116 in FIG. 2 can also be provided as a second RDL layer 224. The second RDL layer 224 can be being formed from a RDL process in one example. The second RDL layer 224 can include a plurality of redistribution metal lines 226 each comprising a respective RDL interconnect 228 that can be coupled to a package substrate interconnect 128 of the package substrate 108 when the RDL substrate 116 is disposed on the package substrate 108. The vias 208, 220 can be coupled to a second RDL interconnect 228 in the second RDL layer 224 through a RDL deposition and under bump metallization (UBM) formation as one example. A solder bump can be formed and coupled to a second RDL interconnect 228 to couple a corresponding via 208, 220 to a second RDL interconnect 228 in the second RDL layer 224. The vias 208, 220 could also be copper pillars that are formed in direct contact with the second RDL layer 228 as another alternative. This allows the second RDL layer 224 of the RDL substrate 116 to support fan-out connections to the package substrate interconnect 128 of the package substrate 108. This may allow the RDL substrate 116 to provide further enhanced connectivity compatibility with different package substrates 108, while at the same time supporting an embedded capacitor, such as capacitors 118, more closely located to the IC chip 106 to minimize IR drop when coupled to a PDN in the IC package 102. For example, package substrates that are less costly to manufacture may only support substrate interconnects that have a larger pitch. As alternative, note that substrate layer 204 of the RDL substrate 116 in FIG. 2 can also be provided as a laminate substrate comprising a laminate layer of organic material that does not include RDLs.

Figure 3:
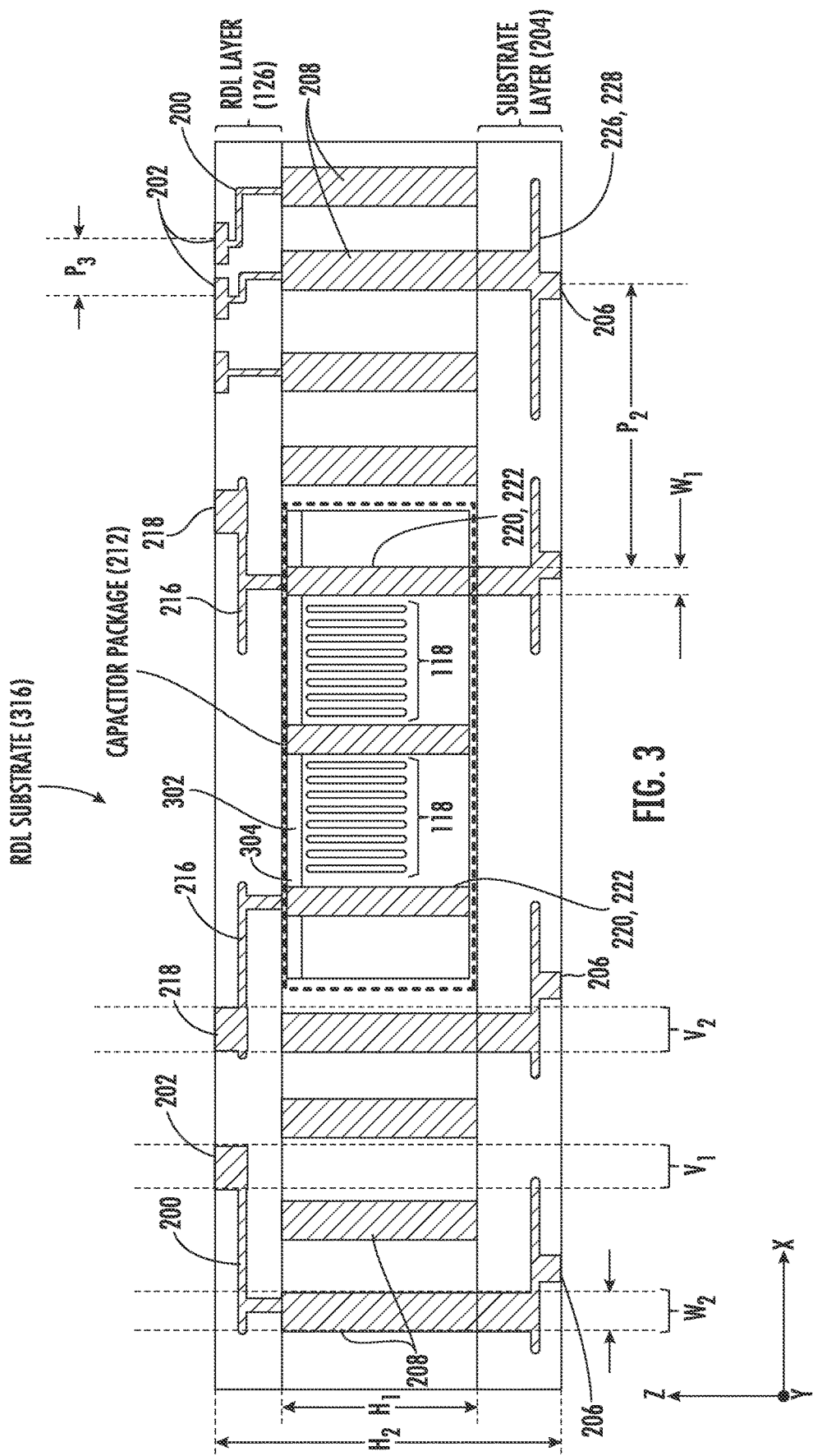
FIG. 3 is another side view of another exemplary capacitor-embedded, RDL substrate in FIG. 2.

FIG. 3 is a side view of another RDL substrate 316 that can be provided as the RDL substrate 116 in the IC package 102 in FIGS. 1 and 2. The RDL substrate 316 includes additional exemplary features that will now be discussed. Common elements between the RDL substrate 316 in FIG. 3 and the RDL substrate 116 in FIGS. 1 and 2 are shown with common element numbers.

As shown in FIG. 3, a passivation layer 302 can be provided in the RDL substrate 316 and disposed between the capacitor package 212 and the RDL layer 126 of the RDL substrate 316. Providing the passivation layer 302 of dielectric material may provide for enhanced alignment between top surfaces 304 of the TSVs 222 and the redistribution metal lines 216 for reduced resistance and thus reduced IR drop through the capacitors 118. The passivation layer 302 can be patterned and opened to allow the redistribution metal lines 216 to be formed in the openings for enhanced alignment between the TSVs 222 and the redistribution metal lines 216, as will be later described in more detail. In this example, the TSVs 222 extend through the passivation layer 302 to be in contact with the redistribution metal lines 216 of the RDL layer 126.

With continued reference to FIG. 3, note that the vias 220 can be employed to provide connectivity to the capacitors 118 in the capacitor package 212 and the RDL interconnects 218 in the RDL layer 126. Also note that the vias 220 may also be fabricated to pass through the capacitor package 212 and its dielectric layer 214 as through-vias to be coupled to a substrate interconnect 206 to provide coupling to the package substrate 108 in FIG. 1. In this regard, the vias 220 can be provided as TSVs 222 as previously discussed to extend through the capacitor package 212. This allows the vertical path space in the Z-axis direction in the path of the capacitor package 212 to allow connectivity between the RDL layer 126 and the substrate layer 204 to minimize the capacitor package's 212 vertical path interconnection disturbance in the RDL substrate 116. Providing the vias 220 as TSVs 222 may allow a greater height $H_1$ to width $W_1$ aspect ratio to allow the RDL substrate 316 to support a greater density of vias 220 to provide connectivity between the IC chip 106, the RDL substrate 316, and the package substrate 108. This may be particularly advantageous since the RDL substrate 316 is provided with its RDL layer 126 to support a fan-out of the RDL interconnects 202, 218, which in turn may support interconnection compatibility with an IC chip 106 having a higher density of die interconnects 120. Also, the overall height width $H_2$ of the RDL substrate 316 to support the capacitor package 212 and the embedded capacitors 118 may require a certain desired height $H_1$-to-width $W_1$ aspect ratio of the TSVs 222 to support the density of interconnections provided in the RDL substate 316. For example, the aspect ratio of height $H_1$ to width $W_1$ of the TSVs 222 may be at least 2.0. Also, the vias 208 may also be provided as TSVs, and may also include a higher $H_1$-to-width $W_2$ aspect ratio of at least 1.0 for the same reasons as discussed above for the TSVs 222.

As discussed above, providing the RDL substrates 116, 316 with a RDL layer 126 allows fan-out of the redistribution metal lines 200, 216 to support a higher density of their respective RDL interconnects 202, 218. For example, as shown in FIGS. 2 and 3 in the RDL substrates 116, 316, the redistribution metal lines 200 are fanned-out outside a vertical path $V_1$ of their respective RDL interconnects 202. Similarly, as shown in FIGS. 2 and 3 in the RDL substrates 116, 316, the redistribution metal lines 216 are fanned-out outside a vertical path $V_2$ of their respective RDL interconnect 218. This allows the die interconnects 120 in the IC chip 106 in FIG. 1 to have a tighter (i.e., smaller) pitch $P_1$ than a pitch $P_2$ of the substrate interconnects 206 in the substrate layer 204. The pitch $P_3$ of the RDL interconnects 202 of the RDL layer 126 of the RDL substrates 116, 316 may be the same as a pitch $P_4$ of the of the package substrate interconnects 128 of the package substate 108. The pitch $P_2$ of the substrate interconnects 206 of the substrate layer 204 of the RDL substrates 116, 316 may be configured to be compatible with the pitch $P_4$ of the package substrate interconnects 128 of the package substate 108 as previously discussed. The pitch $P_2$ of the substrate interconnects 206 of the substrate layer 204 of the RDL substrates 116, 316 may be the same as the pitch $P_4$ of the of the package substrate interconnects 128 of the package substate 108.

Also, note that the RDL substrates 116, 316 could also be configured to act as a interposer between two or more IC chips, like the IC chip 106, that are provided in an IC package, like the IC package 102 in FIG. 2. Additional IC chips could be provided in the IC package 102 that include components like the IC chip 106 described above. The RDL substrate 116, 316 would be disposed between the package substrate 108 and the additional IC chip(s). The RDL substrates 116, 316 could further include additional, second redistribution metal lines each including additional, second RDL interconnects coupled to a die interconnect of an additional IC chip(s). One or more of the additional, second redistribution metal lines could be coupled to one or more of the redistribution metal lines 200 in the RDL substrate 116 to electrically the IC chip 106 to another IC chip(s).

Figure 4:
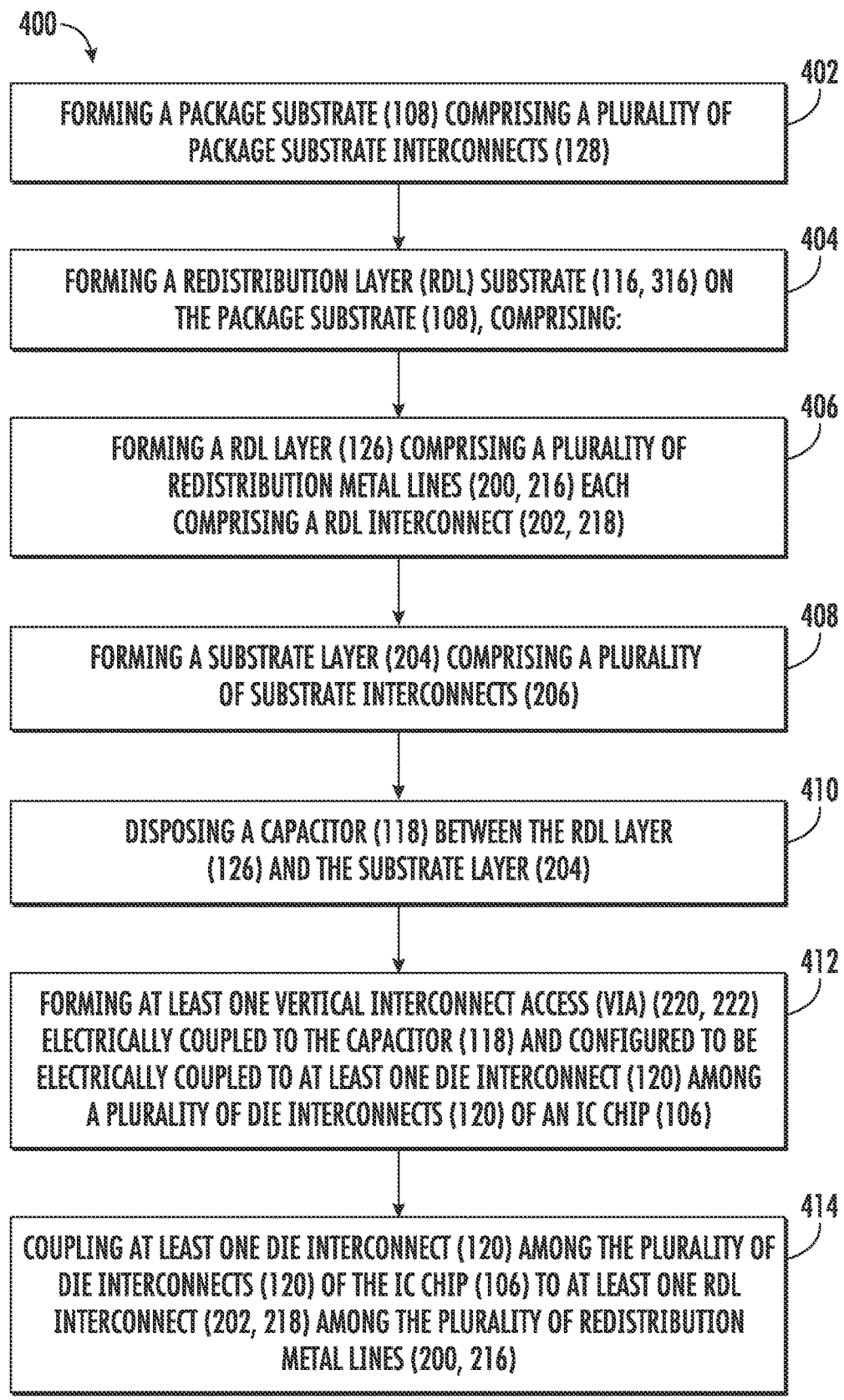
FIG. 4 is a flowchart illustrating an exemplary process of fabricating an IC package that includes a capacitor-embedded, RDL substrate disposed between an IC chip(s) and package substrate, including, but not limited to, the IC packages and RDL substrates in FIGS. 1-3.

FIG. 4 is a flowchart illustrating an exemplary process 400 of fabricating an IC package that includes a capacitor-embedded, RDL substrate disposed between an IC chip(s) and package substrate, including, but not limited to, the IC package 102 in FIG. 1 and its RDL substrate in FIGS. 1-3.

The exemplary process 400 will be referenced in FIG. 2 with reference to the IC package 102 in FIG. 2, and the RDL substrates 116, 316 in FIGS. 2 and 3.

In this regard, a first step in the fabrication process 400 to fabricate the IC package 102 can be forming a package substrate 108 comprising a plurality of package substrate interconnects 128 (block 402 in FIG. 4). A next step in the fabrication process 400 to fabricate the IC package 102 can be forming a RDL substrate 116, 316 on the package substrate 108 (block 404 in FIG. 4). The process of forming the RDL substate 116, 316, can include forming a RDL layer 126 comprising a plurality of redistribution metal lines 200, 216 each comprising a RDL interconnect 202, 218 (block 406 in FIG. 4). The process of forming the RDL substate 116, 316, can also include forming a substrate layer 204 comprising a plurality of substrate interconnects 206 (block 408 FIG. 4). The process of forming the RDL substate 116, 316, can also include disposing a capacitor 118 between the RDL layer 126 and the substrate layer 204 (block 410 in FIG. 4). A next step in the fabrication process 400 to fabricate the IC package 102 can be forming at least one via 220, 222 electrically coupled to the capacitor 118 and configured to be electrically coupled to at least one die interconnect 120 among a plurality of die interconnects 120 of the IC chip 106 (block 412 in FIG. 4). A next step in the fabrication process 400 to fabricate the IC package 102 can be coupling at least one die interconnect 120 among the plurality of die interconnects 120 of the IC chip 106 to at least one RDL interconnect 202, 218 among the plurality of redistribution metal lines 200, 216 (block 414 in FIG. 4).

An IC package that includes a capacitor-embedded, RDL substrate disposed between an IC chip(s) and package substrate, including, but not limited to, the IC package 102 in FIG. 1 and its RDL substrate in FIGS. 1-3, can be fabricated in other fabrication processes. For example, FIGS. 5A-5G illustrate exemplary fabrication stages 500A-500G of another exemplary process 600 in FIGS. 6A-6D of fabricating an IC package that includes a capacitor-embedded, RDL substrate disposed between an IC chip(s) and package substrate, including, but not limited to, the IC packages and RDL substrates in FIGS. 1-3. FIGS. 6A-6D are a flowchart illustrating the exemplary process 600 of fabricating the IC package that includes a capacitor-embedded, RDL substrate disposed between an IC chip(s) and package substrate according to the exemplary fabrication stages 500A-500G in FIGS. 5A-5G. In the exemplary process 600 in FIGS. 6A-6D and according to the exemplary fabrication stages 500A-500G in FIGS. 5A-5G, as discussed below, a RDL layer of the RDL substrate of the IC package is formed before a capacitor package is embedded in the RDL substrate. The exemplary process 600 in FIGS. 6A-6D is discussed below with reference to the fabrication stages 500A-500G in FIGS. 5A-5G. The exemplary process 600 in FIGS. 6A-6D is also discussed with reference to the IC package 102 in FIG. 1 and the RDL substrates 116, 316 in FIGS. 2 and 3, as examples.

In this regard, FIG. 5A illustrates a first fabrication stage 500A of the IC package 102 in FIG. 1. In this fabrication stage 500A, a carrier 502 is provided. The RDL layer 224 is formed on the carrier 502 to be provided in an eventually formed RDL substrate 116, 316 (block 602 in FIG. 6A). The carrier 502 is used to allow the RDL layer 224 and RDL substrate 116, 316 of the IC package 102 to be formed before the capacitor package 212 is embedded in the RDL substrate 116, 316. FIG. 5B illustrates a next fabrication stage 500B of the IC package 102 in FIG. 1. As shown in the next fabrication stage 500B in FIG. 5B, the vias 208, which may be TMVs and that are outside of an area 504 where the capacitor package 212 will be disposed, are formed on the RDL layer 224 and in electrical contact with the redistribution metal lines 226 of the RDL layer 224 (block 604 in FIG. 6A).

Figure 5E:
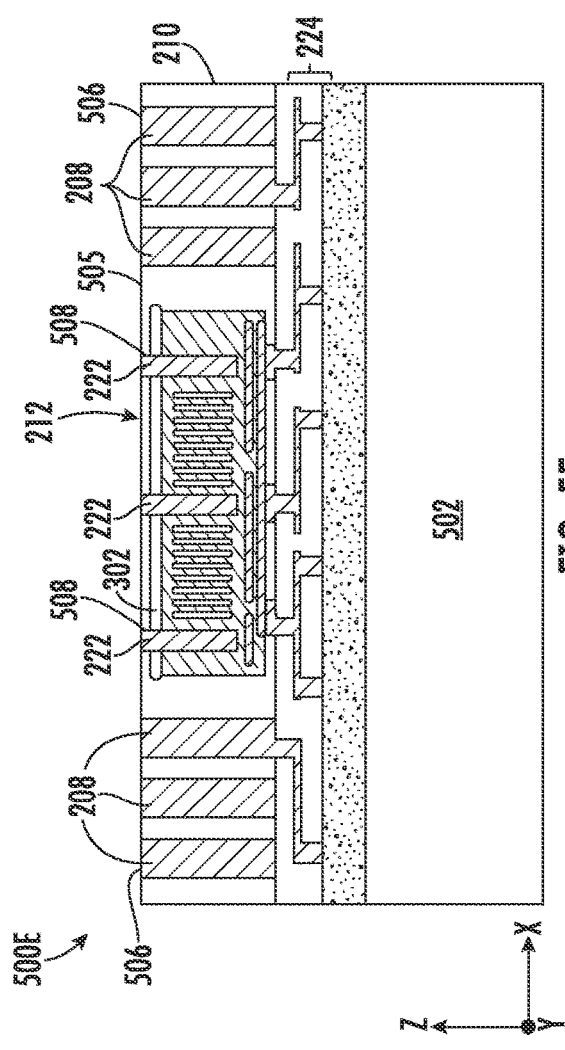
Figure 5F:
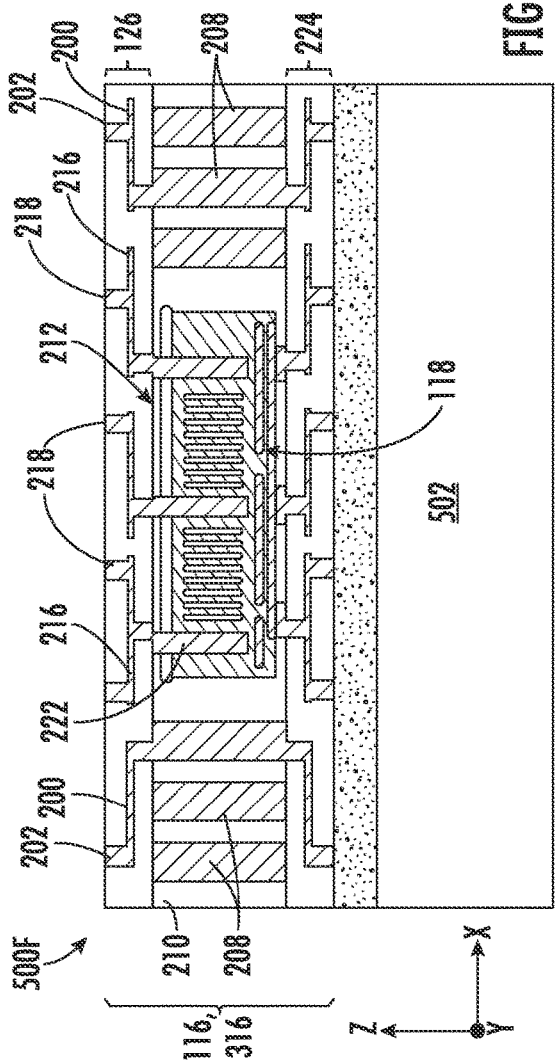
Figure 6C:
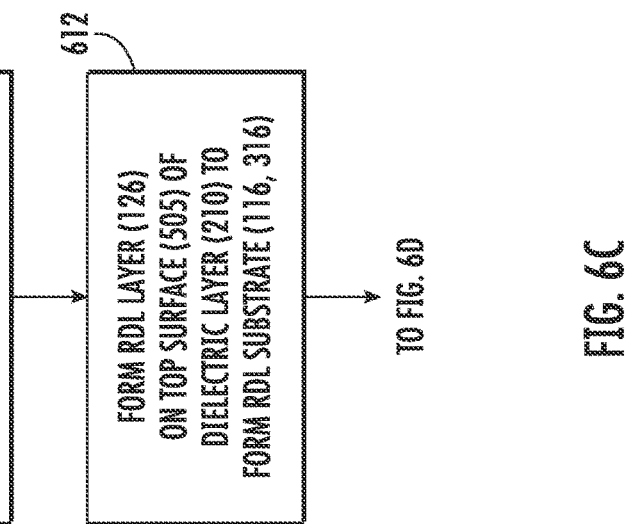

As shown in a next fabrication stage 500C in FIG. 5C, the capacitor package 212 is disposed on the RDL layer 224 to prepare the capacitor package 212 to be embedded in the eventually formed RDL substrate 116, 316 that includes the RDL layer 224 (block 606 in FIG. 6B). Note that the TSVs 222 are exposed through the passivation layer 302 through a separate process to fabricate the capacitor package 212 that is described with reference to FIGS. 7A-8 below. As shown in a next fabrication stage 500D in FIG. 5D, the dielectric layer 210 is then disposed over the vias 208, the capacitor package 212, and the exposed TSVs 222 as part of forming the RDL substrate (block 608 in FIG. 6B). As shown in a next fabrication stage 500E in FIG. 5E, the dielectric layer 210 is ground down to a top surface 505 to expose top surfaces 506, 508 of the vias 208 and the TSVs 222 to prepare these vias 208 and TSVs 222 for connection to the RDL layer 126 to be formed for the RDL substrate 116, 316 (block 610 in FIG. 6C). As shown in a next fabrication stage 500F in FIG. 5F, the RDL layer 126 is formed on the top surface 505 of the dielectric layer 210 that was ground down to form the RDL substrate 116, 316. The redistribution metal lines 200, 216 are electrically coupled to the respective top surfaces 506, 508 of the vias 208 and TSVs 222 as part of forming the RDL layer 126 (block 612 in FIG. 6C). As shown in a next fabrication stage 500G in FIG. 5G, the IC chip 106 is then coupled to the RDL layer 126 of the RDL substrate 116, 316 to form the IC package 102 (block 614 in FIG. 6D).

Figure 8:
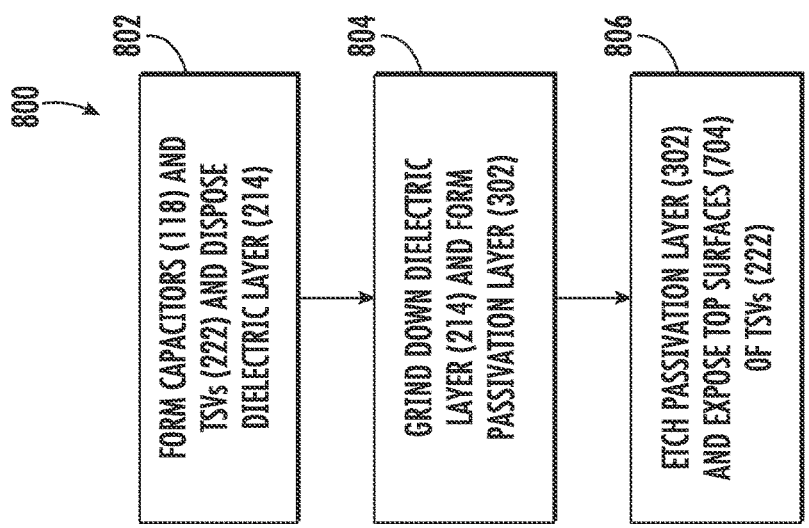
FIG. 8 is a flowchart illustrating an exemplary process of fabricating the embedded capacitor package according to the exemplary fabrication stages in FIGS. 7A-7C.
Figure 7A:
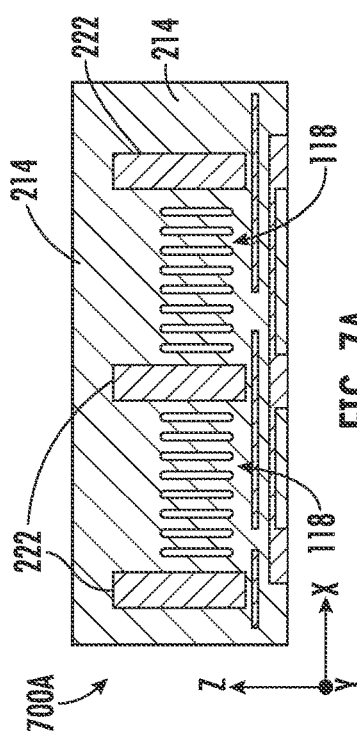
FIGS. 7A-7C illustrate exemplary fabrication stages of an exemplary process of fabricating an embedded capacitor package that can be embedded in a RDL substrate of an IC package, including, but not limited to, the IC packages and RDL substrates in FIGS. 1-3 and 5G.
Figure 7B:
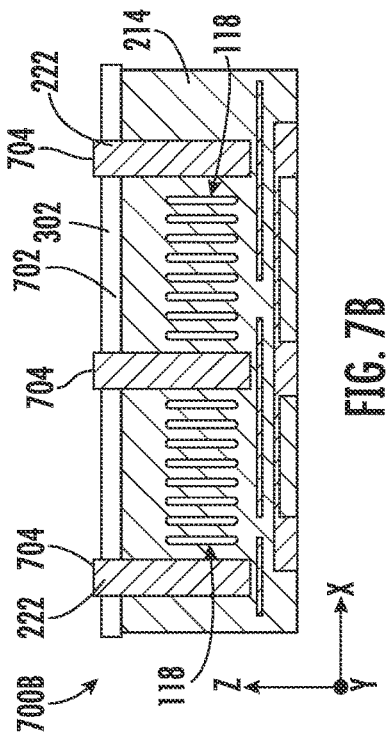
Figure 7C:
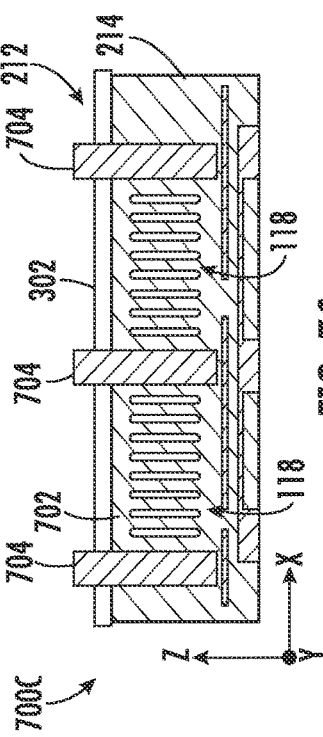
Figure 12A:
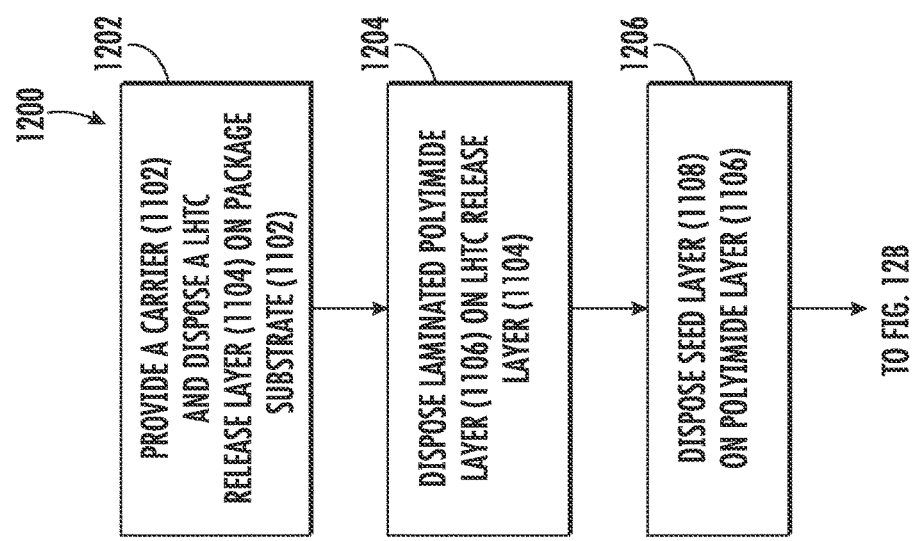

FIGS. 7A-7C illustrate exemplary fabrication stages 700A-700C of an exemplary process of fabricating the capacitor package 212 that can be embedded in the RDL substrate of an IC package, including, but not limited to, the IC packages 102 and RDL substrates 116, 316 in FIGS. 1-3 and 5G. FIG. 8 is a flowchart illustrating an exemplary process 800 of fabricating the capacitor package 212 according to the exemplary fabrication stages 700A-700C in FIGS. 7A-7C. FIGS. 7A-7C and FIG. 8 will be discussed on conjunction.

In this regard, as shown in a fabrication stage 700A in FIG. 7A, the capacitors 118 and TSVs 222 are formed with the dielectric layer 214 disposed over the capacitors 118 and TSVs 222 (block 802 in FIG. 8). As shown in a next fabrication stage 700B in FIG. 7B, the dielectric layer 214 is ground down to a top surface 702 to expose top surfaces 704 of the TSVs 222. Then, a passivation layer 302 is disposed over the top surface 702 of the dielectric layer 214 and the TSVs 222 (block 804 in FIG. 8). As shown in a next fabrication stage 700C in FIG. 7C, the passivation layer 302 is etched to expose the top surfaces 704 of the TSVs 222 to prepare same for electrical connection to the redistribution metal lines 216 of the RDL layer 126 of the RDL substrate 116, 316 (block 806 in FIG. 8).

FIGS. 9A-9H illustrate exemplary fabrication stages 900A-900H of another exemplary process 1000 in FIGS. 10A-10D of fabricating an IC package that includes a capacitor-embedded, RDL substrate disposed between an IC chip(s) and package substrate, including, but not limited to, the IC packages and RDL substrates in FIGS. 1-3. FIGS. 10A-10D area flowchart illustrating the exemplary process 1000 of fabricating the IC package that includes a capacitor-embedded, RDL substrate disposed between an IC chip(s) and package substrate according to the exemplary fabrication stages 900A-900H in FIGS. 9A-9H. In the exemplary process 1000 in FIGS. 10A-10D and according to the exemplary fabrication stages 900A-900H in FIGS. 9A-9H, as discussed below, a RDL layer of the RDL substrate of the IC package is formed before a capacitor package is embedded in the RDL substrate like in the process 800 in FIGS. 8A-8D discussed above. However, the passivation layer 302 is not included in the capacitor package 312 in the process 1000 in FIGS. 10A-10D. The exemplary process 1000 FIGS. 10A-10D is discussed below with reference to the fabrication stages 900A-900H in FIGS. 9A-9H. The exemplary process 1000 FIGS. 10A-10D is also discussed with reference to the IC package 102 in FIG. 1 and the RDL substrates 116, 316 in FIGS. 2 and 3, as examples.

In this regard, FIG. 9A illustrates a first fabrication stage 900A of the IC package 102 in FIG. 1 according to an alternative fabrication process. In this fabrication stage 900A, a carrier 902 is provided. The RDL layer 224 is formed on the carrier 902 to be provided in an eventually formed RDL substrate 116, 316 (block 1002 in FIG. 10A). The carrier 902 is used to allow the RDL layer 224 and RDL substrate 116, 316 of the IC package 102 to be formed before the capacitor package 212 is embedded in the RDL substrate 116, 316. FIG. 9B illustrates a next fabrication stage 900B of the IC package 102 in FIG. 1. As shown in the next fabrication stage 900B in FIG. 9B, the vias 208, which may be TMVs and that are outside of an area 904 where the capacitor package 212 will be disposed, are formed on the RDL layer 224 and in electrical contact with the redistribution metal lines 226 of the RDL layer 224 (block 1004 in FIG. 10A). As shown in a next fabrication stage 900C in FIG. 9C, the capacitor package 212 is disposed on the RDL layer 224 to prepare the capacitor package 212 to be embedded in the eventually formed RDL substrate 116, 316 that includes the RDL layer 224 (block 1006 in FIG. 10A). Note that there is no passivation layer 302 included in the capacitor package 212 as described in the process above in FIGS. 5A-8.

As shown in a next fabrication stage 900D in FIG. 9D, the dielectric layer 210 is then disposed over the vias 208 and the capacitor package 212 as part of forming the RDL substrate (block 1008 in FIG. 10B). As shown in a next fabrication stage 900E in FIG. 9E, the dielectric layer 210 is ground down to a top surface 906 to expose top surfaces 908, 910 of the vias 208 and the TSVs 222 to prepare these vias 208 and TSVs 222 for connection to the RDL layer 126 to be formed for the RDL substrate 116, 316 (block 1010 in FIG. 10B). As shown in a next fabrication stage 900F in FIG. 9F, the RDL layer 126 is formed on the top surface 906 of the dielectric layer 210 that was ground down to form the RDL substrate 116, 316. The redistribution metal lines 200, 216 are electrically coupled to the respective top surfaces 908, 910 of the vias 208 and TSVs 222 as part of forming the RDL layer 126 (block 1012 in FIG. 10C).

As shown in a next fabrication stage 900G in FIG. 9G, the RDL substrate 116, 316 disposed on the carrier 902 is flipped to prepare the carrier 902 to be removed (block 1014 in FIG. 10D). As shown in a next fabrication stage 900H in FIG. 9H, the IC chip 106 is then coupled to the RDL layer 126 of the RDL substrate 116, 316 to form the IC package 102 (block 1016 in FIG. 10D).

FIGS. 11A-11L illustrate exemplary fabrication stages 1100A-1100L of another exemplary process 1200 in FIGS. 12A-12F of fabricating an IC package that includes a capacitor-embedded, RDL substrate disposed between an IC chip(s) and package substrate, including, but not limited to, the IC packages and RDL substrates in FIGS. 1-3. FIGS.

12A-112F are a flowchart illustrating the exemplary process 1200 of fabricating the IC package that includes a capacitor-embedded, RDL substrate disposed between an IC chip(s) and package substrate according to the exemplary fabrication stages 1100A-1100L in FIGS. 11A-11L. In the exemplary process 1200 in FIGS. 12A-12F and according to the exemplary fabrication stages 1100A-1100L in FIGS. 11A-11L, as discussed below, a RDL layer of the RDL substrate of the IC package is formed after a capacitor package is embedded in the RDL substrate. The exemplary process 1200 FIGS. 12A-12F is discussed below with reference to the fabrication stages 1100A-1100L in FIGS. 11A-11L. The exemplary process 1200 FIGS. 12A-12F is also discussed with reference to the IC package 102 in FIG. 1 and the RDL substrates 116, 316 in FIGS. 2 and 3, as examples.

Figure 11A:
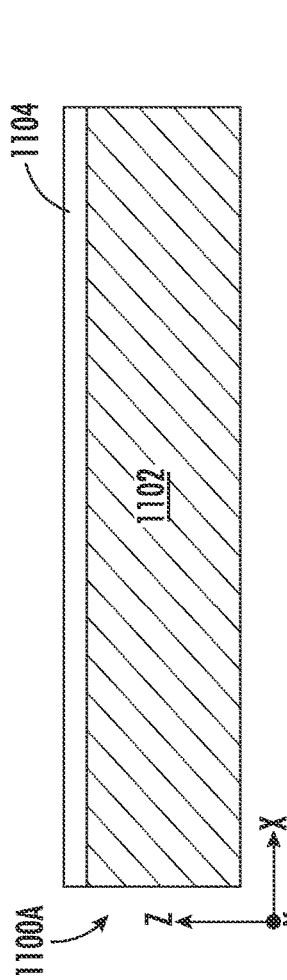
Figure 11B:
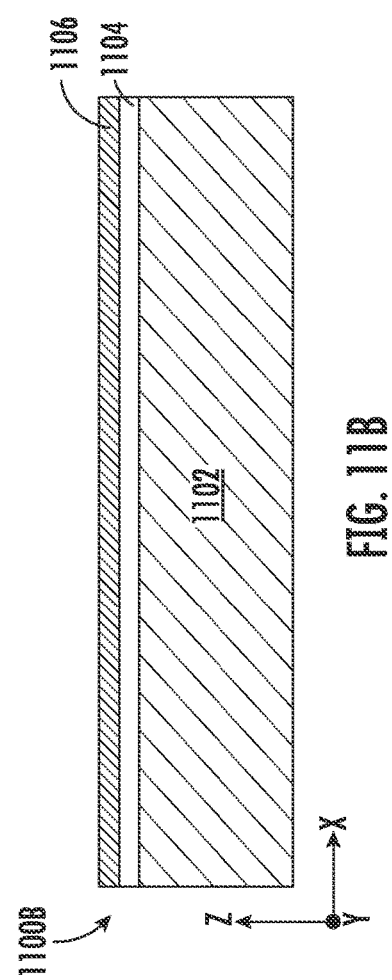
Figure 11C:
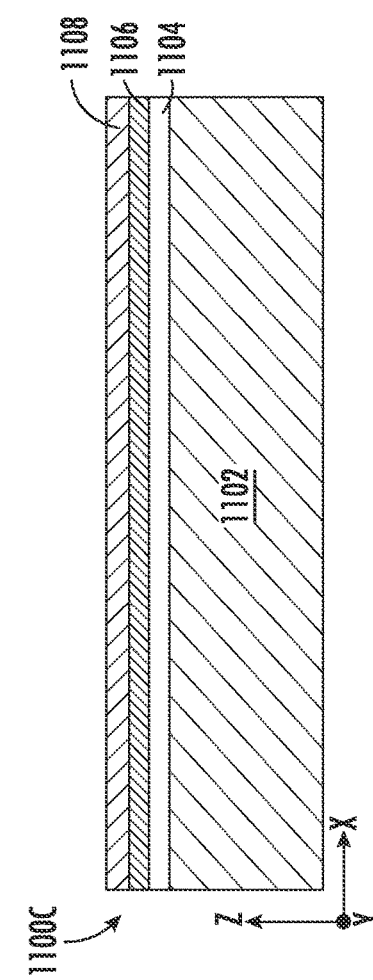
Figure 11J:
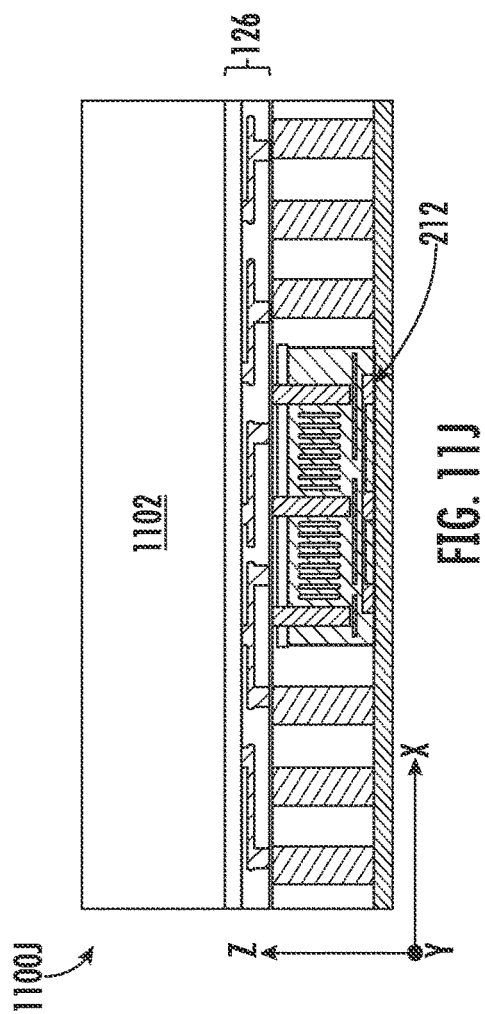

As shown in a fabrication stage 1100A in FIG. 11A, the package substrate 108 of a carrier 1102 is started to be prepared. A carrier 1102 is provided, such as a laminate substrate, and a coating is disposed on the carrier 1002 through a light-to-heat conversion (LTHC) release layer 1104 (block 1202 in FIG. 12A). As shown in a next fabrication stage 1100B in FIG. 11B, a laminated polyimide layer 1106 is disposed on the LTHC release layer 1104 (block 1204 in FIG. 12A). As shown in a next fabrication stage 1100C in FIG. 11C, a seed layer 1108 (e.g., a TiCu layer) is disposed on the laminated polyimide layer 1106 to prepare for forming the vias 208 (block 1206 in FIG. 12A). As shown in a next fabrication stage 1100D in FIG. 11D, a photoresist layer 1110 is disposed on the seed layer 1108 to prepare for the photoresist layer 1110 to be patterned to form openings 1112 as shown to form the vias 208 (block 1208 in FIG. 12B). As shown in a next fabrication stage 1100E in FIG. 11E, the vias 208 are formed in the openings 1112 (block 1210 in FIG. 12B). For example, the vias 208 can be copper pillars.

As shown in a next fabrication stage 1100F in FIG. 11F, the capacitor package 212 is then disposed in the area 1114 between the vias 208 to eventually become part of a fabricated RDL substrate 116, 316 (block 1212 in FIG. 12C). As shown in a next fabrication stage 1100G in FIG. 11G, a dielectric layer 210 is disposed on the vias 208 and capacitor package 212 (block 1214 in FIG. 12D). As shown in a next fabrication stage 1100H in FIG. 11H, the dielectric layer 210 is ground down to a top surface 1116 to expose the top surfaces 1118, 1120 of the vias 208 and the TSVs 222 of the capacitor package 212 (block 1216 in FIG. 12D). As shown in a next fabrication stage 1100I in FIG. 11I, the RDL layer 126 is formed on the top surface 1116 of the dielectric layer 210 to form a portion of the RDL substrate 116, 316 (block 1218 in FIG. 12E). As shown in a next fabrication stage 1100J in FIG. 11J, the carrier 1102 is flipped and removed with the dielectric layer 210 with embedded capacitor package 212 and RDL layer 126 separated to prepare to form the second RDL layer 224 of the RDL substrate 116, 316 (block 1220 in FIG. 12E).

Figure 11K:
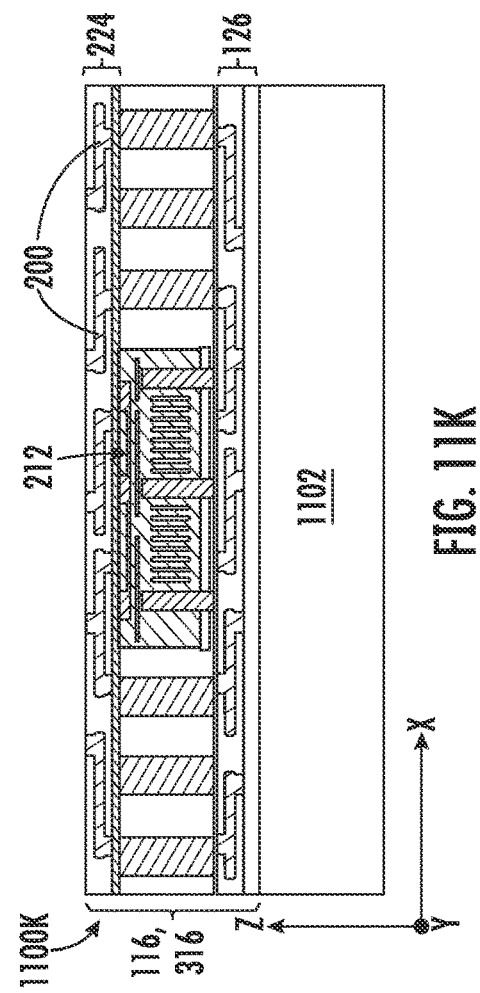
Figure 12E:
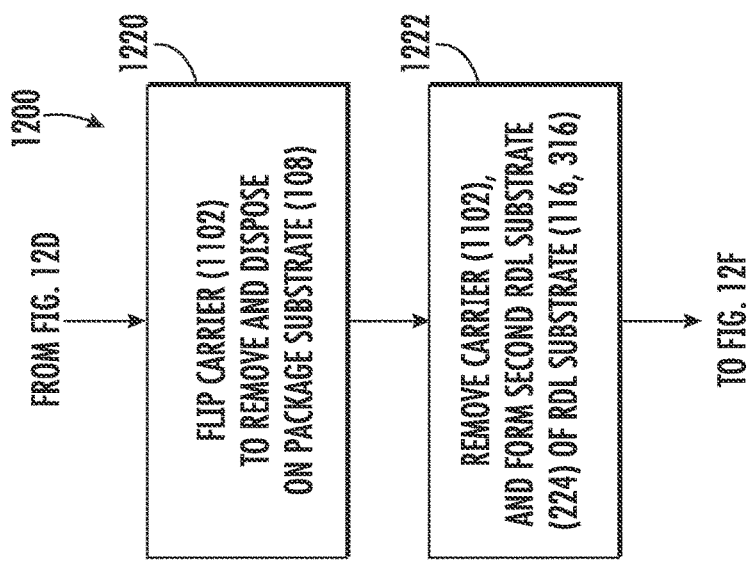
Figure 12F:
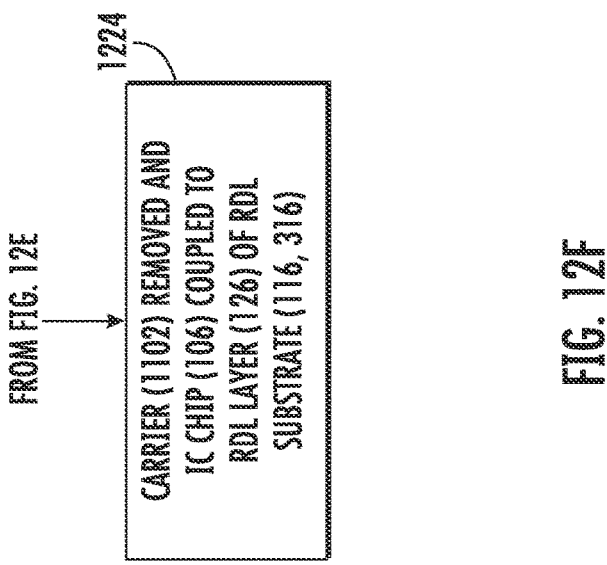
Figure 11L:
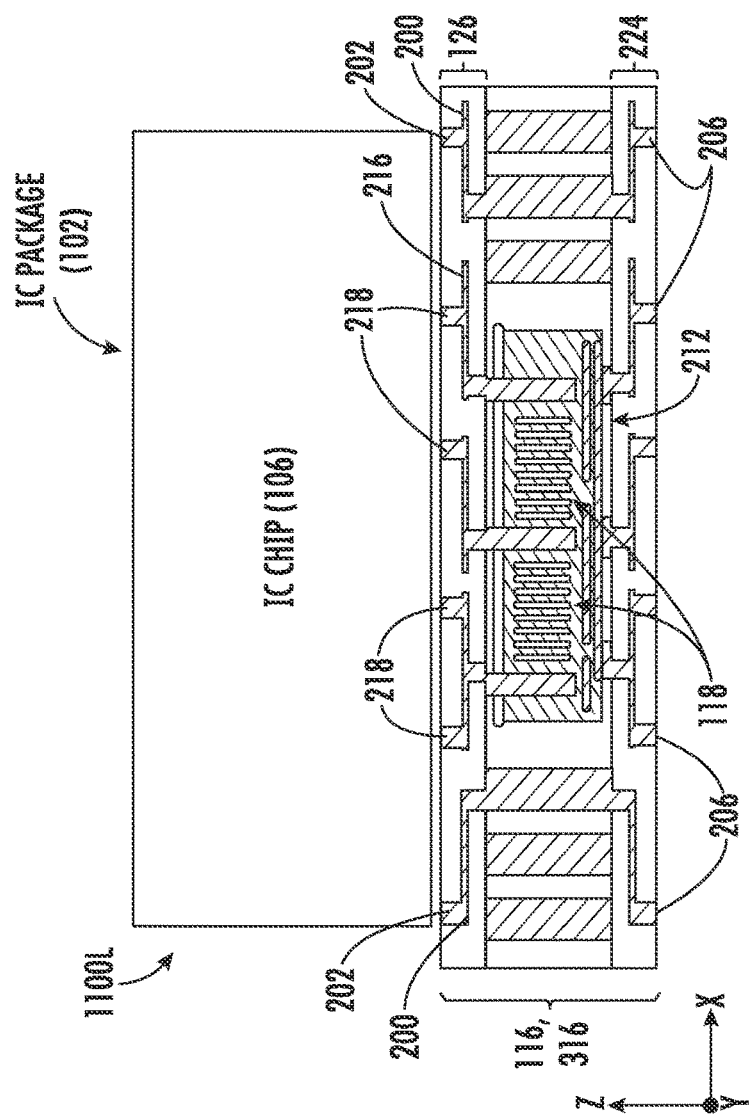

As shown in a next fabrication stage 1100K in FIG. 11K, the second RDL layer 224 of the RDL substrate 116, 316 is formed to form the RDL substrate 116, 316 (block 1222 in FIG. 12E). As shown in a next fabrication stage 11L in FIG. 1L, the IC chip 106 is then coupled to the RDL layer 126 of the RDL substrate 116, 316 to form the IC package 102 (block 1224 in FIG. 12F).

It should be understood that that the terms "top," "above," "bottom," below," where used herein, are relative terms and are not meant to limit or imply a strict orientation. A "top" referenced element does not always be oriented to be above a "bottom" referenced element with respect to ground, and vice versa. An element referenced as "top" or "bottom" may be on top or bottom relative to that example only and the particular illustrated example. An element referenced as "above" or "below" another element does not have to be with respect to ground, and vice versa. An element referenced as "above" or "below" may be on above or below and to such other referenced element, relative to that example only and the particular illustrated example.

IC packages that include a RDL substrate with an embedded capacitor(s) disposed between an IC chip(s) and package substrate, including, but not limited to, the IC packages in FIGS. 1-3, 5G, 9H, and 11L, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
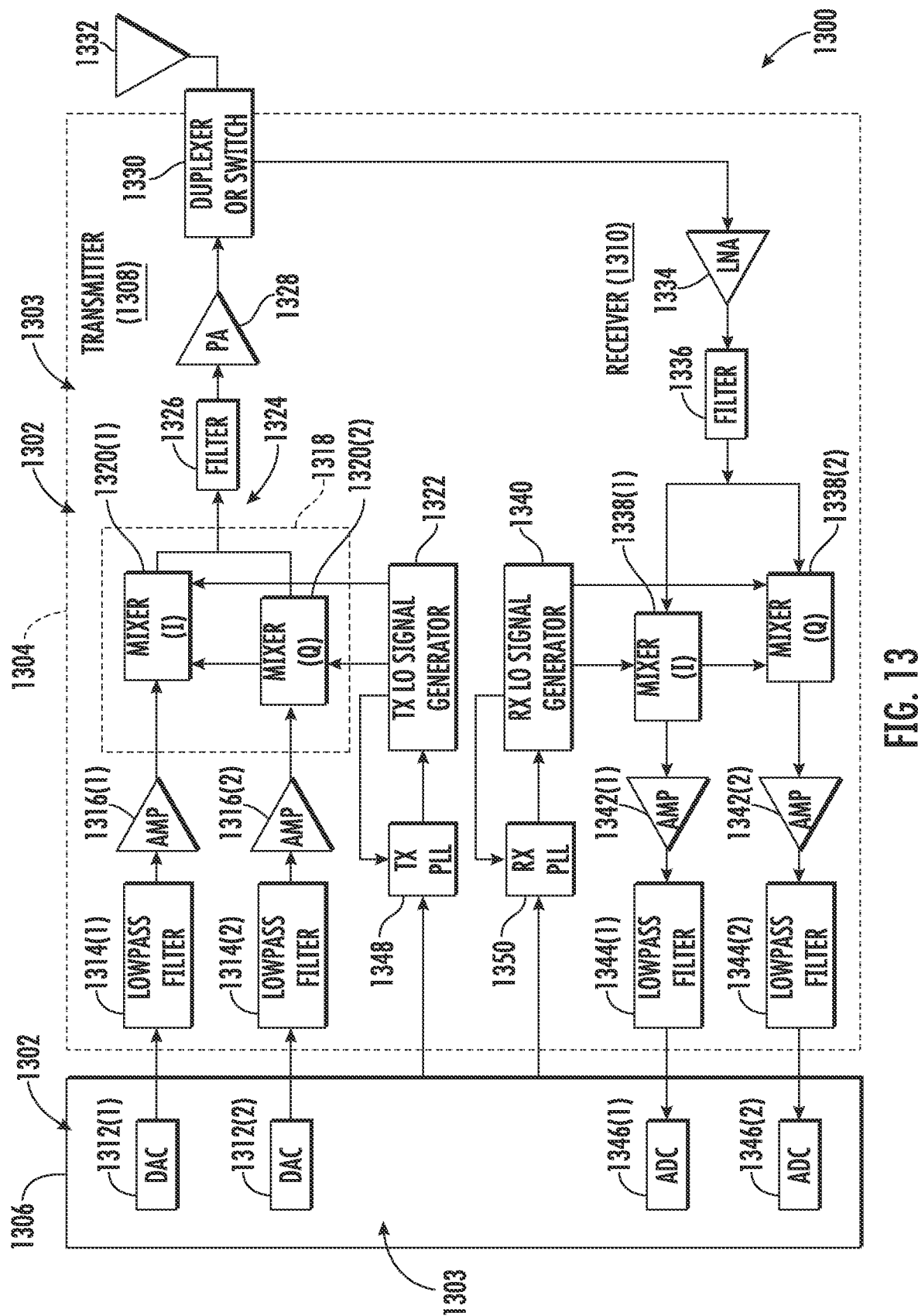
FIG. 13 is a block diagram of an exemplary wireless communications device that includes electrical components formed from one or more IC packages that include a capacitor-embedded, RDL substrate disposed between an IC chip(s) and package substrate, including, but not limited to, the IC packages in FIGS. 1-3, 5G, 9H, and 11L.

FIG. 13 illustrates an exemplary wireless communications device 1300 that includes electrical components formed from one or more ICs 1302, wherein any of the ICs 1302 can be included in an IC package 1303. The IC package 1303 can include IC packages that include a RDL substrate with an embedded capacitor(s) disposed between an IC chip(s) and package substrate, including, but not limited to, the IC packages in FIGS. 1-3, 5G, 9H, and 11L, and according to any aspects disclosed herein.

The wireless communications device 1300 may include or be provided in any of the above referenced devices, as examples. As shown in FIG. 13, the wireless communications device 1300 includes a transceiver 1304 and a data processor 1306. The data processor 1306 may include a memory to store data and program codes. The transceiver 1304 includes a transmitter 1308 and a receiver 1310 that support bi-directional communications. In general, the wireless communications device 1300 may include any number of transmitters 1308 and/or receivers 1310 for any number of communication systems and frequency bands. All or a portion of the transceiver 1304 may be implemented on one or more analog ICs, RF ICs (RFICs), mixed-signal ICs, etc.

The transmitter 1308 or the receiver 1310 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1310. In the direct-conversion architecture, a signal is frequency-converted between RF and baseband in one stage. The super-heterodyne and direct-conversion architectures may use different circuit blocks and/or have different requirements. In the wireless communications device 1300 in FIG. 13, the transmitter 1308 and the receiver 1310 are implemented with the direct-conversion architecture.

In the transmit path, the data processor 1306 processes data to be transmitted and provides I and Q analog output signals to the transmitter 1308. In the exemplary wireless communications device 1300, the data processor 1306 includes digital-to-analog converters (DACs) 1312(1), 1312(2) for converting digital signals generated by the data processor 1306 into the I and Q analog output signals, e.g., I and Q output currents, for further processing.

Within the transmitter 1308, lowpass filters 1314(1), 1314(2) filter the I and Q analog output signals, respectively, to remove undesired signals caused by the prior digital-to-analog conversion. Amplifiers (AMPs) 1316(1), 1316(2) amplify the signals from the lowpass filters 1314(1), 1314(2), respectively, and provide I and Q baseband signals. An upconverter 1318 upconverts the I and Q baseband signals with I and Q transmit (TX) local oscillator (LO) signals through mixers 1320(1), 1320(2) from a TX LO signal generator 1322 to provide an upconverted signal 1324. A filter 1326 filters the upconverted signal 1324 to remove undesired signals caused by the frequency upconversion as well as noise in a receive frequency band. A power amplifier (PA) 1328 amplifies the upconverted signal 1324 from the filter 1326 to obtain the desired output power level and provides a transmit RF signal. The transmit RF signal is routed through a duplexer or switch 1330 and transmitted via an antenna 1332.

In the receive path, the antenna 1332 receives signals transmitted by base stations and provides a received RF signal, which is routed through the duplexer or switch 1330 and provided to a low noise amplifier (LNA) 1334. The duplexer or switch 1330 is designed to operate with a specific receive (RX)-to-TX duplexer frequency separation, such that RX signals are isolated from TX signals. The received RF signal is amplified by the LNA 1334 and filtered by a filter 1336 to obtain a desired RF input signal. Downconversion mixers 1338(1), 1338(2) mix the output of the filter 1336 with I and Q RX LO signals (i.e., LO_I and LO_Q) from an RX LO signal generator 1340 to generate I and Q baseband signals. The I and Q baseband signals are amplified by AMPs 1342(1), 1342(2) and further filtered by lowpass filters 1344(1), 1344(2) to obtain I and Q analog input signals, which are provided to the data processor 1306. In this example, the data processor 1306 includes analog-to-digital converters (ADCs) 1346(1), 1346(2) for converting the analog input signals into digital signals to be further processed by the data processor 1306.

In the wireless communications device 1300 of FIG. 13, the TX LO signal generator 1322 generates the I and Q TX LO signals used for frequency upconversion, while the RX LO signal generator 1340 generates the I and Q RX LO signals used for frequency downconversion. Each LO signal is a periodic signal with a particular fundamental frequency. A TX phase-locked loop (PLL) circuit 1348 receives timing information from the data processor 1306 and generates a control signal used to adjust the frequency and/or phase of the TX LO signals from the TX LO signal generator 1322. Similarly, an RX PLL circuit 1350 receives timing information from the data processor 1306 and generates a control signal used to adjust the frequency and/or phase of the RX LO signals from the RX LO signal generator 1340.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are also described in the following numbered clauses:

1. An integrated circuit (IC) package, comprising.
   a package substrate comprising a plurality of package substrate interconnects;
   an IC chip comprising a plurality of die interconnects;
   a redistribution layer (RDL) substrate disposed between the package substrate and the IC chip, the RDL substrate comprising:
      a RDL layer comprising a plurality of redistribution metal lines each comprising a RDL interconnect coupled to a die interconnect among the plurality of die interconnects;
      a substrate layer comprising a plurality of substrate interconnects; and
      a capacitor disposed between the RDL layer and the substrate layer; and
   at least one vertical interconnect access (via) electrically coupled to a die
      interconnect among the plurality of die interconnects and the capacitor.
2. The IC package according to clause 1, wherein the substrate layer comprises a second RDL layer comprising a plurality of second redistribution metal lines each comprising a second RDL interconnect.
3. The IC package according to clause 2, further comprising at the least one second via coupled to a die interconnect among the plurality of die interconnects and at least one substrate interconnect among the plurality of substrate interconnects in the substrate layer.
4. The IC package according to any of clauses 1 to 3, further comprising a passivation layer disposed between the capacitor and the RDL layer.
5. The IC package according to any of clauses 1 to 4, wherein at least one via comprises at least one through-silicon-via (TSV) disposed through the RDL substrate and electrically coupled to a redistribution metal line among the plurality of redistribution metal lines coupled to the die interconnect.
6. The IC package according to clause 5, wherein the aspect ratio of height to width of the at least one TSV is at least 2.0.
7. The IC package according to any of clauses 1 to 6, further comprising a plurality of second vias disposed through the RDL substrate and electrically coupled to a RDL interconnect among a plurality of RDL interconnects in the RDL layer and a substrate interconnect among the plurality of substrate interconnects in the substrate layer.
8. The IC package according to clause 7, wherein the aspect ratio of height to width of the plurality of second vias is at least 1.0.
9. The IC package according to any of clauses 1 to 8, further comprising:
   a dielectric layer comprising a dielectric material disposed between the RDL layer and the substrate layer; and
   a capacitor package embedded in the dielectric layer, the capacitor package comprising the capacitor.
10. The IC package according to clause 9, wherein the at least one via comprises at least one through-silicon-via (TSV) disposed through the capacitor package and electrically coupled to a redistribution metal line among the plurality of redistribution metal lines coupled to the die interconnect.
11. The IC package according to clause 9, further comprising a plurality of second vias disposed through the RDL substrate and electrically coupled to a RDL interconnect among a plurality of RDL interconnects in the RDL layer and a substrate interconnect among the plurality of substrate interconnects in the substrate layer;
    wherein the plurality of second vias are disposed through the dielectric layer of the RDL substrate outside of the capacitor package.
12. The IC package according to any of clauses 1 to 11, wherein at least one redistribution metal line among the plurality of redistribution metal lines is fanned-out outside a vertical path of its respective RDL interconnect.
13. The IC package according to clause of any of clauses 1 to 12, wherein:
    the plurality of die interconnects have a first pitch;
    the plurality of substrate interconnects in the substrate layer have a second pitch greater than the first pitch; and
    the plurality of package substrates interconnects have the second pitch.
14. The IC package according to clause 13, further comprising a plurality of second vias disposed through the RDL substrate and electrically coupled to a RDL interconnect among a plurality of RDL interconnects in the RDL layer and a substrate interconnect among the plurality of substrate interconnects in the substrate layer coupled to a package substrate interconnect among the plurality of package substrate interconnects.
15. The IC package according to any of clauses 1 to 14, wherein:
    the package substrate further comprises a first outer surface, the plurality of package substrate interconnects disposed through the first outer surface;
    the IC chip further comprises an active surface, the plurality of die interconnects disposed through the active surface; and
    a distance between the first outer surface and the active surface is at least two (2) micrometers (μm).
16. The IC package according to any of clauses 1 to 15 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer, a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
17. A method of fabricating an IC package, comprising:
    forming a package substrate comprising a plurality of package substrate interconnects;

forming a redistribution layer (RDL) substrate on the package substrate, comprising:
  forming a RDL layer comprising a plurality of redistribution metal lines each comprising a RDL interconnect;
  forming a substrate layer comprising a plurality of substrate interconnects; and
  disposing a capacitor between the RDL layer and the substrate layer;
forming at least one vertical interconnect access (via) electrically coupled to the capacitor and configured to be electrically coupled to at least one die interconnect among a plurality of die interconnects of the IC chip; and
coupling at least one die interconnect among a plurality of die interconnects of an IC chip to at least one RDL interconnect among the plurality of redistribution metal lines.

18. The method according to clause 17, wherein forming the substrate layer comprises forming a second RDL layer comprising a plurality of second redistribution metal lines each comprising a second RDL interconnect; and
further comprising:
  coupling at least one package substrate interconnect among the plurality of package substrate interconnects to at least one second RDL interconnect among a plurality of second RDL interconnects; and
  disposing the capacitor between the RDL layer and the substrate layer comprises disposing the capacitor between the RDL layer and the second RDL layer.

19. The method according to any of clauses 17 to 18, further comprising forming at least one second via electrically coupled to at least one die interconnect among the plurality of die interconnects and at least one substrate interconnect among the plurality of substrate interconnects.

20. The method according to clause 19, wherein forming the at least one second via further comprises forming the least one second via outside a vertical path of the capacitor.

21. The method according to any of clauses 17 and 19-20, wherein forming the substrate layer comprises forming a second RDL layer on the package substrate comprising a plurality of second redistribution metal lines each comprising a second RDL interconnect, to electrically couple the second RDL interconnect among the plurality of second redistribution metal lines to at least one second RDL interconnect among the second RDL interconnects.

22. The method according to clause 21, further comprising forming a passivation layer above a first side of the capacitor opposite a second side of the capacitor adjacent to the second RDL layer.

23. The method according to any of clauses 19 to 22, further comprising forming a dielectric layer comprising a dielectric material over the at least one via, the at least one second via, and the capacitor.

24. The method according to clause 23, further comprising grinding down a surface of the dielectric layer to expose a top surface of each of the at least one via from the dielectric layer.

25. The method according to clause 24, further comprising forming the RDL layer above the dielectric layer on a first side of the dielectric layer opposite the second RDL layer to electrically couple the at least one via to at least one RDL interconnect among the plurality of redistribution metal lines.

26. The method according to any of clauses 17 to 25, further comprising:
providing a carrier; and
forming a plurality of second vias on the carrier.

27. A redistribution layer (RDL) substrate, comprising:
  a RDL layer comprising a plurality of redistribution metal lines each comprising a RDL interconnect;
  a substrate layer comprising a plurality of substrate interconnects,
  a dielectric layer comprising a dielectric material disposed between the RDL layer and the substrate layer;
  a capacitor package embedded in the dielectric layer, the capacitor package comprising a capacitor; and
  a plurality of through-silicon-vertical interconnect accesses (vias) (TSVs) disposed through the capacitor package and electrically coupled to RDL interconnect among a plurality of RDL interconnects.

28. The RDL substrate according to clause 27, wherein:
  the capacitor package further comprises a metal layer comprising at least one metal line coupled to the capacitor; and
  at least one TSV among the plurality of TSVs is coupled to the at least one metal line coupled to the capacitor.

29. The RDL substrate according to clause 27, wherein at least one TSV among the plurality of TSVs is coupled to at least one substrate interconnect among the plurality of substrate interconnects in the substrate layer.

30. The RDL substrate according to any of clauses 27 to 29, wherein the substrate layer comprises a second RDL layer comprising a plurality of second redistribution metal lines each comprising a second RDL interconnect.

31. The RDL substrate according to any of clauses 27 to 30, wherein the RDL layer comprises an outer surface and the RDL interconnects of the plurality of redistributed metal lines are disposed through the outer surface.

32. The RDL substrate according to any of clauses 27 to 31, further comprising a passivation layer disposed between the capacitor package and the RDL layer.

33. The RDL substrate according to clause 32, wherein the plurality of TSVs extend through the passivation layer.

34. The RDL substrate according to any of clauses 27 to 33, wherein the aspect ratio of height to width of the plurality of TSVs is at least two (2) micrometers (μm).

35. The RDL substrate according to any of clauses 27 to 34, further comprising a plurality of vias disposed through the dielectric layer and electrically coupled to a RDL interconnect among a plurality of RDL interconnects and a substrate interconnect among the plurality of substrate interconnects.

36. The RDL substrate according to any of clauses 27 to 35, further comprising a plurality of second vias disposed through the dielectric layer of the RDL substrate and electrically coupled to a RDL interconnect among a plurality of RDL interconnects in the RDL layer and a substrate interconnect among the plurality of substrate interconnects in the substrate layer.

37. The RDL substrate according to clause 36, wherein the aspect ratio of height to width of the plurality of second vias is at least 1.0.

38. The IC package according to any of clauses 36 to 37, wherein the plurality of second vias are disposed through the dielectric layer of the RDL substrate outside of the capacitor package.

39. The RDL substrate according to any of clauses 27 to 38, wherein the capacitor package comprises the dielectric layer comprising the dielectric material, wherein the capacitor is embedded in the dielectric layer.

What is claimed is:

1. An integrated circuit (IC) package, comprising:
   a package substrate comprising a plurality of package substrate interconnects;
   an IC chip comprising a plurality of die interconnects;
   a redistribution layer (RDL) substrate disposed between the package substrate and the IC chip, the RDL substrate comprising:
      a first RDL layer comprising one or more first RDL interconnects each coupled to a first die interconnect among the plurality of die interconnects; and
      a second RDL layer comprising one or more second RDL interconnects each coupled to a package substrate interconnect of the plurality of package substrate interconnects;
      a dielectric layer disposed between the first RDL layer and the second RDL layer; and
      a capacitor package embedded in the dielectric layer, the capacitor package comprising a capacitor;
      the dielectric layer comprising:
         one or more first vias each coupled to a first RDL interconnect of the one or more first RDL interconnects; and
         one or more second vias that extend through the dielectric layer and are disposed through the capacitor package and each coupled to a first RDL interconnect of the one or more first RDL interconnects, and each coupled to a second RDL interconnect of the one or more second RDL interconnects; and
   a molding on the IC chip, the RDL substrate, and the package substrate.

2. The IC package of claim 1, wherein the one or more first vias are each coupled to a second RDL interconnect among the one or more second RDL interconnects in the second RDL layer.

3. The IC package of claim 1, further comprising a passivation layer disposed between the capacitor and the first RDL layer.

4. The IC package of claim 1, wherein the aspect ratio of height to width of the one or more first vias is at least 2.0.

5. The IC package of claim 1, wherein the aspect ratio of height to width of the one or more second vias is at least 1.0.

6. The IC package of claim 1, wherein the one or more second vias comprise one or more through-silicon-vias (TSVs) disposed through the capacitor package.

7. The IC package of claim 2, wherein the one or more first vias are disposed through the dielectric layer of the RDL substrate outside of the capacitor package.

8. The IC package of claim 1, wherein at least one of the one or more first RDL interconnects is fanned-out outside a vertical path of the capacitor.

9. The IC package of claim 1, wherein:
   the plurality of die interconnects have a first pitch;
   the one or more second RDL interconnects have a second pitch greater than the first pitch; and
   the plurality of package substrate interconnects have the second pitch.

10. The IC package of claim 1, wherein:
    the package substrate further comprises a first outer surface, the plurality of package substrate interconnects disposed through the first outer surface;
    the IC chip further comprises an active surface, the plurality of die interconnects disposed through the active surface; and
    a distance between the first outer surface and the active surface is at least two (2) micrometers (µm).

11. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. The IC package of claim 1, further comprising one or more third vias each coupled to another first RDL interconnect of the one or more first RDL interconnects and the capacitor.

13. A method of fabricating an integrated circuit (IC) package, comprising:
    providing an IC chip comprising a plurality of die interconnects;
    forming a package substrate comprising a plurality of package substrate interconnects;
    forming a redistribution layer (RDL) substrate on the package substrate, comprising:
       forming a first RDL layer comprising one or more first RDL interconnects;
       forming a dielectric layer;
       disposing a capacitor package comprising a capacitor in the dielectric layer;
       forming a second RDL layer comprising one or more second RDL interconnects, wherein the dielectric layer is between the first RDL layer and the second RDL layer;
       forming one or more first vias each coupled to a first RDL interconnect of the one or more first RDL interconnects; and
       forming one or more second vias extending through the dielectric layer and extending through the capacitor package and each coupled to a first RDL interconnect of the one or more first RDL interconnects, and each coupled to a second RDL interconnect of the one or more second RDL interconnects;
    coupling each of the one or more first RDL interconnects to a die interconnect of the plurality of die interconnects of the IC chip;
    coupling each of the one or more second RDL interconnects to a package substrate interconnect of the plurality of package substrate interconnects; and
    forming a molding on the RDL substrate and the package substrate.

14. The method of claim 13, wherein forming the one or more first vias further comprises coupling each of the one or more first vias to a second RDL interconnect among the one or more second RDL interconnects in the second RDL layer outside a vertical path of the capacitor.

15. The method of claim 13, further comprising forming a passivation layer above a first side of the capacitor opposite a second side of the capacitor adjacent to the second RDL layer.

16. The method of claim 13, wherein the dielectric layer comprises a dielectric material over the one or more first vias, the one or more second vias, and the capacitor package.

17. The method of claim 16, further comprising grinding down a surface of the dielectric layer to expose a top surface of each of the one or more first vias from the dielectric layer.

18. The method of claim 17, further comprising forming the first RDL layer above the dielectric layer on a first side of the dielectric layer opposite the second RDL layer to electrically couple the one or more first vias to one or more RDL interconnects among the one or more first RDL interconnects.

19. The method of claim 13, further comprising:
providing a carrier; and
forming the one or more second vias on the carrier.

20. The method of claim 13, wherein forming the RDL substrate further comprises forming one or more third vias each coupled to another first RDL interconnect of the one or more first RDL interconnects and the capacitor.

* * * * *